US011714118B2

(12) United States Patent
Goergen et al.

(10) Patent No.: US 11,714,118 B2
(45) Date of Patent: Aug. 1, 2023

(54) SAFETY MONITORING FOR CABLES TRANSMITTING DATA AND POWER

(71) Applicant: CISCO TECHNOLOGY, INC., San Jose, CA (US)

(72) Inventors: Joel Richard Goergen, Soulsbyville, CA (US); Chad M. Jones, Doylestown, OH (US); Christopher Daniel Bullock, Round Rock, TX (US); Dylan T. Walker, Austin, TX (US)

(73) Assignee: CISCO TECHNOLOGY, INC., San Jose, CA (US)

( * ) Notice: Subject to any disclaimer, the term of this patent is extended or adjusted under 35 U.S.C. 154(b) by 158 days.

(21) Appl. No.: 17/340,277

(22) Filed: Jun. 7, 2021

(65) Prior Publication Data
US 2021/0293872 A1    Sep. 23, 2021

Related U.S. Application Data

(60) Division of application No. 16/696,834, filed on Nov. 26, 2019, now Pat. No. 11,054,457, which is a continuation-in-part of application No. 15/604,344, filed on May 24, 2017, now Pat. No. 10,809,134.

(51) Int. Cl.
*G01R 31/08*    (2020.01)
*G01R 31/11*    (2006.01)

(52) U.S. Cl.
CPC ......... *G01R 31/083* (2013.01); *G01R 31/088* (2013.01); *G01R 31/11* (2013.01)

(58) Field of Classification Search
CPC .... G01R 31/08; G01R 31/083; G01R 31/088; G01R 31/11; G01R 31/58
See application file for complete search history.

(56) References Cited

U.S. PATENT DOCUMENTS 3,335,324 A    8/1967    Buckeridge
3,962,529 A    6/1976    Kubo
4,803,331 A *  2/1989    Cohen ................. B23K 11/252
                                             219/110

(Continued)

FOREIGN PATENT DOCUMENTS

CN    1209880 C     7/2005
CN    201689347 U   12/2010

(Continued)

OTHER PUBLICATIONS

Voltserver Inc., v. Cisco Technology, Inc., "Decision Denying Institution of Post-Grant Review," United States Patent and Trademark Office, PGR2021-00055, Patent 10,735,105 B2, Aug. 19, 2021, 25 pages.

(Continued)

*Primary Examiner* — Tung S Lau

(57) ABSTRACT

In one embodiment, a method generally comprises monitoring real-time electrical data at Power Sourcing Equipment (PSE) transmitting power over a cable to a Powered Device (PD), calculating thermal characteristics for the cable based on the monitored data, and periodically updating the thermal characteristics based on the monitored data. The power comprises multi-phase pulse power, the data comprises voltage and current measured for each phase of the multi-phase pulse power, and the voltage is greater than 60 volts at the PSE.

20 Claims, 15 Drawing Sheets

(56) References Cited

U.S. PATENT DOCUMENTS

| | | |
|---|---|---|
| 4,811,187 A | 3/1989 | Nakajima |
| 4,997,388 A | 3/1991 | Dale |
| 5,602,387 A | 2/1997 | Bowen |
| 5,652,893 A | 7/1997 | Ben-Meir |
| 6,008,631 A | 12/1999 | Johari |
| 6,220,955 B1 | 4/2001 | Posa |
| 6,259,745 B1 | 7/2001 | Chan |
| 6,636,538 B1 | 10/2003 | Stephens |
| 6,685,364 B1 | 2/2004 | Brezina |
| 6,784,790 B1 | 8/2004 | Lester |
| 6,826,368 B1 | 11/2004 | Koren |
| 6,855,881 B2 | 2/2005 | Khoshnood |
| 6,860,004 B2 | 3/2005 | Hirano |
| 7,325,150 B2 | 1/2008 | Lehr |
| 7,420,355 B2 | 9/2008 | Liu |
| 7,490,996 B2 | 2/2009 | Sommer |
| 7,492,059 B2 | 2/2009 | Peker |
| 7,509,505 B2 | 3/2009 | Randall |
| 7,566,987 B2 | 7/2009 | Black et al. |
| 7,583,703 B2 | 9/2009 | Bowser |
| 7,589,435 B2 | 9/2009 | Metsker |
| 7,593,747 B1 | 9/2009 | Karam |
| 7,603,570 B2 | 10/2009 | Schindler |
| 7,616,465 B1 | 11/2009 | Vinciarelli |
| 7,813,646 B2 | 10/2010 | Furey |
| 7,835,389 B2 | 11/2010 | Yu |
| 7,854,634 B2 | 12/2010 | Filipon |
| 7,881,072 B2 | 2/2011 | DiBene |
| 7,915,761 B1 | 3/2011 | Jones |
| 7,921,307 B2 | 4/2011 | Karam |
| 7,924,579 B2 | 4/2011 | Arduini |
| 7,940,787 B2 | 5/2011 | Karam |
| 7,973,538 B2 | 7/2011 | Karam |
| 8,020,043 B2 | 9/2011 | Karam |
| 8,037,324 B2 | 10/2011 | Hussain |
| 8,068,937 B2 | 11/2011 | Eaves |
| 8,081,589 B1 | 12/2011 | Gilbrech |
| 8,184,525 B2 | 5/2012 | Karam |
| 8,276,397 B1 | 10/2012 | Carlson |
| 8,279,883 B2 | 10/2012 | Diab |
| 8,310,089 B2 | 11/2012 | Schindler |
| 8,319,627 B2 | 11/2012 | Chan |
| 8,345,439 B1 | 1/2013 | Goergen |
| 8,350,538 B2 | 1/2013 | Cuk |
| 8,358,893 B1 | 1/2013 | Sanderson |
| 8,386,820 B2 | 2/2013 | Diab |
| 8,638,008 B2 | 1/2014 | Baldwin et al. |
| 8,700,923 B2 | 4/2014 | Fung |
| 8,712,324 B2 | 4/2014 | Corbridge |
| 8,750,710 B1 | 6/2014 | Hirt |
| 8,768,528 B2 | 7/2014 | Millar et al. |
| 8,775,151 B2 * | 7/2014 | Algaonkar ............. G01K 11/32 385/13 |
| 8,781,637 B2 | 7/2014 | Eaves |
| 8,787,775 B2 | 7/2014 | Earnshaw |
| 8,829,917 B1 | 9/2014 | Lo |
| 8,836,228 B2 | 9/2014 | Xu |
| 8,842,430 B2 | 9/2014 | Hellriegel |
| 8,849,471 B2 | 9/2014 | Daniel |
| 8,966,747 B2 | 3/2015 | Vinciarelli |
| 9,024,473 B2 | 5/2015 | Huff |
| 9,184,795 B2 | 11/2015 | Eaves |
| 9,189,043 B2 | 11/2015 | Vorenkamp |
| 9,206,684 B2 * | 12/2015 | Parra .................. H04B 3/54 |
| 9,273,906 B2 | 3/2016 | Goth |
| 9,319,101 B2 | 4/2016 | Lontka |
| 9,321,362 B2 | 4/2016 | Woo |
| 9,373,963 B2 | 6/2016 | Kuznelsov |
| 9,419,436 B2 | 8/2016 | Eaves et al. |
| 9,484,771 B2 | 11/2016 | Braylovskiy |
| 9,510,479 B2 | 11/2016 | Vos |
| 9,531,551 B2 | 12/2016 | Balasubramanian |
| 9,590,811 B2 | 3/2017 | Hunter, Jr. |
| 9,618,714 B2 | 4/2017 | Murray |
| 9,640,998 B2 | 5/2017 | Dawson |
| 9,665,148 B2 | 5/2017 | Hamdi |
| 9,693,244 B2 | 6/2017 | Maruhashi |
| 9,734,940 B1 | 8/2017 | McNutt |
| 9,853,689 B2 | 12/2017 | Eaves |
| 9,874,930 B2 | 1/2018 | Vavilala |
| 9,882,656 B2 | 1/2018 | Sipes, Jr. |
| 9,893,521 B2 | 2/2018 | Eaves |
| 9,948,198 B2 | 4/2018 | Imai |
| 9,979,370 B2 | 5/2018 | Xu |
| 9,985,600 B2 | 5/2018 | Xu |
| 10,007,628 B2 | 6/2018 | Pitigoi-Aron |
| 10,028,417 B2 | 7/2018 | Schmidtke |
| 10,128,764 B1 | 11/2018 | Vinciarelli |
| 10,248,178 B2 | 4/2019 | Brooks |
| 10,263,526 B2 | 4/2019 | Sandusky et al. |
| 10,281,513 B1 | 5/2019 | Goergen |
| 10,407,995 B2 | 9/2019 | Moeny |
| 10,439,432 B2 | 10/2019 | Eckhardt |
| 10,468,879 B2 | 11/2019 | Eaves |
| 10,541,543 B2 | 1/2020 | Eaves |
| 10,541,758 B2 | 1/2020 | Goergen |
| 10,631,443 B2 | 4/2020 | Byers |
| 10,714,930 B1 | 7/2020 | Weiss et al. |
| 10,735,105 B2 | 8/2020 | Goergen et al. |
| 2001/0024373 A1 | 9/2001 | Cuk |
| 2002/0126967 A1 | 9/2002 | Panak |
| 2004/0000816 A1 | 1/2004 | Khoshnood |
| 2004/0033076 A1 | 2/2004 | Song |
| 2004/0043651 A1 | 3/2004 | Bain |
| 2004/0073703 A1 | 4/2004 | Boucher |
| 2004/0264214 A1 | 12/2004 | Xu |
| 2005/0197018 A1 | 9/2005 | Lord |
| 2005/0268120 A1 | 12/2005 | Schindler |
| 2006/0202109 A1 | 9/2006 | Delcher |
| 2006/0209875 A1 | 9/2006 | Lum |
| 2007/0103168 A1 | 5/2007 | Batten |
| 2007/0143508 A1 | 6/2007 | Linnman |
| 2007/0236853 A1 | 10/2007 | Crawley |
| 2007/0263675 A1 | 11/2007 | Lum |
| 2007/0284946 A1 | 12/2007 | Robbins |
| 2007/0288125 A1 | 12/2007 | Quaratiello |
| 2008/0004634 A1 | 1/2008 | Farritor |
| 2008/0054720 A1 | 3/2008 | Lum |
| 2008/0180087 A1 * | 7/2008 | Pankau ................ H02H 3/253 324/76.74 |
| 2008/0198635 A1 | 8/2008 | Hussain |
| 2008/0229120 A1 | 9/2008 | Diab |
| 2008/0310067 A1 | 12/2008 | Diab |
| 2009/0027033 A1 | 1/2009 | Diab |
| 2010/0077239 A1 | 3/2010 | Diab |
| 2010/0117808 A1 | 5/2010 | Karam |
| 2010/0171602 A1 | 7/2010 | Kabbara |
| 2010/0190384 A1 | 7/2010 | Lanni |
| 2010/0237846 A1 | 9/2010 | Vetteth |
| 2010/0290190 A1 | 11/2010 | Chester |
| 2011/0004773 A1 | 1/2011 | Hussain |
| 2011/0007664 A1 | 1/2011 | Diab |
| 2011/0057612 A1 | 3/2011 | Taguchi |
| 2011/0083824 A1 | 4/2011 | Rogers |
| 2011/0218790 A1 * | 9/2011 | Algaonkar ............. G01K 11/32 702/65 |
| 2011/0228578 A1 | 9/2011 | Serpa |
| 2011/0266867 A1 | 11/2011 | Schindler |
| 2011/0290497 A1 | 12/2011 | Stenevik |
| 2012/0043935 A1 | 2/2012 | Dyer |
| 2012/0064745 A1 | 3/2012 | Ottliczky |
| 2012/0170927 A1 | 7/2012 | Huang |
| 2012/0201089 A1 | 8/2012 | Barth |
| 2012/0231654 A1 | 9/2012 | Conrad |
| 2012/0287984 A1 | 11/2012 | Lee |
| 2012/0317426 A1 | 12/2012 | Hunter, Jr. |
| 2012/0319468 A1 | 12/2012 | Schneider |
| 2013/0077923 A1 | 3/2013 | Weem |
| 2013/0079633 A1 | 3/2013 | Weem |
| 2013/0103220 A1 | 4/2013 | Eaves |
| 2013/0249292 A1 | 9/2013 | Blackwell, Jr. |
| 2013/0272721 A1 | 10/2013 | Van Veen |
| 2013/0329344 A1 | 12/2013 | Tucker |
| 2014/0111180 A1 | 4/2014 | Vladan |

(56) References Cited

U.S. PATENT DOCUMENTS

| | | |
|---|---|---|
| 2014/0126151 A1 | 5/2014 | Campbell |
| 2014/0129850 A1 | 5/2014 | Paul |
| 2014/0258742 A1 | 9/2014 | Chien |
| 2014/0258813 A1 | 9/2014 | Lusted |
| 2014/0265550 A1 | 9/2014 | Milligan |
| 2014/0372773 A1 | 12/2014 | Heath |
| 2015/0078740 A1 | 3/2015 | Sipes, Jr. |
| 2015/0106539 A1 | 4/2015 | Leinonen |
| 2015/0115741 A1 | 4/2015 | Dawson |
| 2015/0207317 A1 | 7/2015 | Radermacher |
| 2015/0215001 A1 | 7/2015 | Eaves |
| 2015/0333918 A1 | 7/2015 | Paul |
| 2015/0340818 A1 | 11/2015 | Scherer |
| 2016/0018252 A1 | 1/2016 | Hanson |
| 2016/0020911 A1 | 1/2016 | Sipes, Jr. |
| 2016/0064938 A1 | 3/2016 | Balasubramanian |
| 2016/0111877 A1 | 4/2016 | Eaves |
| 2016/0118784 A1 | 4/2016 | Saxena |
| 2016/0133355 A1 | 5/2016 | Glew |
| 2016/0134331 A1 | 5/2016 | Eaves |
| 2016/0142217 A1 | 5/2016 | Gardner |
| 2016/0188427 A1 | 6/2016 | Chandrashekar |
| 2016/0197600 A1 | 7/2016 | Kuznetsov |
| 2016/0365967 A1 | 7/2016 | Tu |
| 2016/0241148 A1 | 8/2016 | Kizilyalli |
| 2016/0262288 A1 | 9/2016 | Chainer |
| 2016/0273722 A1 | 9/2016 | Crenshaw |
| 2016/0294500 A1 | 10/2016 | Chawgo et al. |
| 2016/0294568 A1 | 10/2016 | Chawgo et al. |
| 2016/0308683 A1 | 10/2016 | Pischl |
| 2016/0352535 A1 | 12/2016 | Hiscock |
| 2017/0041152 A1 | 2/2017 | Sheffield |
| 2017/0041153 A1 | 2/2017 | Picard |
| 2017/0054296 A1 | 2/2017 | Daniel |
| 2017/0089192 A1* | 3/2017 | Rendusara ............ E21B 43/128 |
| 2017/0110871 A1 | 4/2017 | Foster |
| 2017/0123466 A1 | 5/2017 | Carnevale |
| 2017/0146260 A1 | 5/2017 | Ribbich |
| 2017/0155517 A1 | 6/2017 | Cao |
| 2017/0164525 A1 | 6/2017 | Chapel |
| 2017/0155518 A1 | 7/2017 | Yang |
| 2017/0214236 A1 | 7/2017 | Eaves |
| 2017/0229886 A1 | 8/2017 | Eaves |
| 2017/0234738 A1 | 8/2017 | Ross |
| 2017/0244318 A1 | 8/2017 | Giuliano |
| 2017/0248976 A1 | 8/2017 | Moller |
| 2017/0294966 A1 | 10/2017 | Jia |
| 2017/0325320 A1 | 11/2017 | Wendt |
| 2018/0003402 A1* | 1/2018 | Lambert Grossi ....... F24F 11/30 |
| 2018/0024964 A1 | 1/2018 | Mao |
| 2018/0053313 A1 | 2/2018 | Smith |
| 2018/0054083 A1 | 2/2018 | Hick |
| 2018/0060269 A1 | 3/2018 | Kessler |
| 2018/0088648 A1 | 3/2018 | Otani |
| 2018/0098201 A1 | 4/2018 | Torello et al. |
| 2018/0102604 A1 | 4/2018 | Keith |
| 2018/0123360 A1 | 5/2018 | Eaves |
| 2018/0159430 A1 | 6/2018 | Albert |
| 2018/0188712 A1 | 7/2018 | MacKay |
| 2018/0191513 A1 | 7/2018 | Hess |
| 2018/0254624 A1 | 9/2018 | Son |
| 2018/0313886 A1 | 11/2018 | Mlyniec et al. |
| 2018/0340840 A1 | 11/2018 | Bullock |
| 2019/0126764 A1 | 5/2019 | Fuhrer |
| 2019/0267804 A1 | 8/2019 | Matan |
| 2019/0272011 A1 | 9/2019 | Goergen |
| 2019/0277899 A1 | 9/2019 | Goergen |
| 2019/0277900 A1 | 9/2019 | Goergen |
| 2019/0278347 A1 | 9/2019 | Goergen |
| 2019/0280895 A1 | 9/2019 | Mather et al. |
| 2019/0304630 A1 | 10/2019 | Goergen |
| 2019/0312751 A1 | 10/2019 | Goergen |
| 2019/0342011 A1 | 10/2019 | Goergen |
| 2019/0363493 A1 | 11/2019 | Sironi |
| 2020/0044751 A1 | 2/2020 | Goergen |
| 2020/0153174 A1 | 5/2020 | Curtis et al. |
| 2022/0190587 A1 | 6/2022 | Eaves et al. |

FOREIGN PATENT DOCUMENTS

| | | |
|---|---|---|
| CN | 103597776 A | 2/2014 |
| CN | 104698297 A | 6/2015 |
| CN | 204836199 U | 12/2015 |
| CN | 205544597 | 8/2016 |
| CN | 104081237 B | 10/2016 |
| CN | 106165342 A | 11/2016 |
| CN | 106249087 A | 12/2016 |
| CN | 106465162 A | 2/2017 |
| CN | 104412541 B | 5/2019 |
| EP | 1936861 A1 | 6/2008 |
| EP | 2120443 A1 | 11/2009 |
| EP | 2257009 A2 | 1/2010 |
| EP | 2432134 A1 | 3/2012 |
| EP | 2693688 A1 | 2/2014 |
| WO | WO199316407 A1 | 8/1993 |
| WO | WO2006127916 A2 | 11/2006 |
| WO | WO2010053542 | 5/2010 |
| WO | WO2017054030 | 4/2017 |
| WO | WO2017167926 A1 | 10/2017 |
| WO | WO2018017544 A1 | 1/2018 |
| WO | WO2019023731 A1 | 2/2019 |
| WO | WO2019212759 A1 | 11/2019 |

OTHER PUBLICATIONS

*Voltserver Inc.*, v. *Cisco Systems, Inc.*, "Patent Owner's Preliminary Response to Post Grant Review Under 35 U.S.C. § 312 and 37 C.F.R. § 42.107," United States Patent and Trademark Office, PGR2021-00055, U.S. Pat. No. 10,735,105, 2021, Jun. 2, 2021, 51 pages.

"Effects of current on human beings and livestok—Part 1: General aspects," Technical Specification, Basic Safety Publication, IEC/TS 60479-1, Edition 4.0, Jul. 2005, 122 pages.

"Information technology equipment—Safety—Part 1: General requirements," International Standard, IEC 60950-1, Edition 2.2, May 2013, pp. 1-61, 63 pages.

"Information technology equipment—Safety—Part 1: General requirements," International Standard, IEC 60950-1, Edition 2.2, May 2013, pp. 62-122, 61 pages.

"Information technology equipment—Safety—Part 1: General requirements," International Standard, IEC 60950-1, Edition 2.2, May 2013, pp. 123-181, 59 pages.

"Information technology equipment—Safety—Part 1: General requirements," International Standard, IEC 60950-1, Edition 2.2, May 2013, pp. 182-253, 72 pages.

"Information technology equipment—Safety—Part 1: General requirements," International Standard, IEC 60950-1, Edition 2.2, May 2013, pp. 254-319, 66 pages.

"Information technology equipment—Safety—Part 1: General requirements," International Standard, IEC 60950-1, Edition 2.2, May 2013, pp. 320-377, 58 pages.

"Information technology equipment—Safety—Part 1: General requirements," International Standard, IEC 60950-1, Edition 2.2, May 2013, pp. 378-433, 56 pages.

"Information technology equipment—Safety—Part 1: General requirements," International Standard, IEC 60950-1, Edition 2.2, May 2013, pp. 434-490, 57 pages.

"Information technology equipment—Safety—Part 1: General requirements," International Standard, IEC 60950-1, Edition 2.2, May 2013, pp. 491-551, 61 pages.

"Information technology equipment—Safety—Part 1: General requirements," International Standard, IEC 60950-1, Edition 2.2, May 2013, pp. 552-622, 71 pages.

"Information technology equipment—Safety—Part 1: General requirements," International Standard, IEC 60950-1, Edition 2.2, May 2013, pp. 623-644, 24 pages.

(56) References Cited

OTHER PUBLICATIONS

"Low-voltage switchgear and controlgear—Part 1: General rules," International Standard, Amendment 2, IEC 60947-1, Edition 5.0, Sep. 2014, pp. 1-63, 65 pages.

"Low-voltage switchgear and controlgear—Part 1: General rules," International Standard, Amendment 2, IEC 60947-1, Edition 5.0, Sep. 2014, pp. 64-102, 41 pages.

Stephen Edelstein, "Updated 2016 Tesla Model S also gets new 75-kWhbattery option," Internet Archive WayBack Machine, Green Car Reports, May 5, 2016, 3 pages.

Stephen S. Eaves, "Network Remote Powering using Packet Energy Transfer," IEEE Xplore, Proceedings of IEEE International Conference on Telecommunications Energy (INTELEC) 2012, 978-1-4673-1000, Sep. 30-Oct. 4, 2012, 4 pages.

"Audio/video, information and communication technology equipment—Part 1: Safety requirements," International Standard, IEC 62368-1, Edition 2.0, Feb. 2014, pp. 1-132, 134 pages.

"Audio/video, information and communication technology equipment—Part 1: Safety requirements," International Standard, IEC 62368-1, Edition 2.0, Feb. 2014, pp. 133-263, 131 pages.

"Audio/video, information and communication technology equipment—Part 1: Safety requirements," International Standard, IEC 62368-1, Edition 2.0, Feb. 2014, pp. 264-387, 124 pages.

"Audio/video, information and communication technology equipment—Part 1: Safety requirements," International Standard, IEC 62368-1, Edition 2.0, Feb. 2014, pp. 388-508, 121 pages.

"Audio/video, information and communication technology equipment—Part 1: Safety requirements," International Standard, IEC 62368-1, Edition 2.0, Feb. 2014, pp. 509-593, 85 pages.

"Audio/video, information and communication technology equipment—Part 1: Safety requirements," International Standard, IEC 62368-1, Edition 2.0, Feb. 2014, pp. 594-676, 85 pages.

"National Electrical Code," National Fire Protection Association (NFPA) 70, 2017, 881 pages.

*Voltserver Inc.*, v. *Cisco Technology, Inc.*, "Declaration of David A. Durfee, Ph.D.," United States Patent and Trademark Office, PGR2021-00055, U.S. Pat. No. 10,735,105, Feb. 16, 2021, 340 pages.

David A. Durfee Ph.D., "Curriculum Vitae," 4 pages.

Adel S. Sedra, "Microelectronic Circuits," Sedra/Smith, Oxford University Press, Seventh Edition, 2015, 38 pages.

Charles k. Alexander, et al., "Fundamentals of Electric Circuits," McGraw Hill Education, Indian Edition 5e, 2013, 37 pages.

Andrew S. Tanenbaum, "Computer Networks," Prentice Hall PTR, Third Edition, 1996, 12 pages.

William Stallings, "Data and Computer Communications," Macmillan Publishing Company, Fourth Edition, 1994, 14 pages.

B.P. Lathi, et al., "Modern Digital and Analog Communication Systems," Oxford University Press, Fourth Edition, 2009, 15 pages.

*Voltserver Inc.*, v. *Cisco Technology, Inc.*, "Petition for Post Grant Review of U.S. Pat. No. 10,735,105," United States Patent and Trademark Office, PGR2021-00055, U.S. Pat. No. 10,735,105, Feb. 16, 2021, 132 pages.

Stephen H. Hall, et al., "High-Speed Digital System Design: A handbook of Interconnect Theory and Design Practices,", John Wiley & Sons, Inc., 2000, 55 pages.

"Understanding 802.3at, PoE Plus Standard Increases Available Power," Microsemi, Jun. 2011, 7 pages.

"Digital Electricity Gen2 Detailed Installation Manual," Voltserver Digital Electricity, Rev B.1, Nov. 29, 2017, 68 pages.

Berkeley Lab ETA, "Touch-Safe, High Voltage Digital Electricity Transmission using Packet Energy Transfer," Vimeo, https://vimeo.com/172469008, Mar. 8, 2016, 8 pages.

*Voltserver Inc.*, v. *Cisco Technology, Inc.*, "Decision Denying Institution of Post-Grant Review," United States Patent and Trademark Office, PGR2021-00056, U.S. Pat. No. 10,735,105 B2, Aug. 23, 2021, 18 pages.

*Voltserver Inc.*, v. *Cisco Systems, Inc.*, "Patent Owner's Preliminary Response to Post Grant Review Under 35 U.S.C. § 312 and 37 C.F.R. § 42.107," United States Patent and Trademark Office, PGR2021-00056, U.S. Pat. No. 10,735,105, 2021, Jun. 2, 2021, 46 pages.

*Voltserver Inc.*, v. *Cisco Technology, Inc.*, "Declaration of Stephens S. Eaves," United States Patent and Trademark Office, PGR2021-00056, U.S. Pat. No. 10,735,105, Feb. 16, 2021, 7 pages.

"Electrical—Computer Conference Proceedings," Internet Archive WayBack Machine Search for Intelec 2012, Curran Associates, Inc., http://www.proceedings.com/electrical-computer-proceedings.html, 2012, 125 pages.

"Part VII: A Summary of Commonly Used MARC 21 Fields," Marc, Understanding MARC, https://www.loc.gov/marc//umb/um07to10.html, retrieved from Internet Feb. 13, 2021, 17 pages.

LC Catalog-Browse, https://catalog.loc.gov/vwebv/searchBrowse, retrieved from the Internet Feb. 12, 2021, 1 page.

"International Telecommunications Energy Conference: [proceedings] (Marc Tags)," Library Catalog, https://catalog.loc.gov/vwebv/staffView?searchId=3877&recPointer=0&recCount=25&searchType=1&bibId=11348322, retrieved from the Internet Feb. 12, 2021, 3 pages.

*Voltserver Inc.*, v. *Cisco Technology, Inc.*, "Petition for Post Grant Review of U.S. Pat. No. 10,735,105," United States Patent and Trademark Office, PGR2021-00056, U.S. Pat. No. 10,735,105, Feb. 16, 2021, 116 pages.

"International Telecommunications Energy Conference: [proceedings] (Full Record)," Library Catalog, https://catalog.loc.gov/vwebv/holdingsInfo?searchId=3810&recPointer=0&recCount=25&searchType=1&bibId=11348322, retrieved from the Internet Feb. 12, 2021, 4 pages.

"Selecting Cables for Power Over Ethernet," Hitachi Cable America Inc., Aug. 12, 2017, 7 Pages.

Extended European Search Report for European Application No. 21156406.7, dated May 10, 2021, 12 Pages.

Hirshmann, "Power over Ethernet (POE), IEE 802.3af" White Paper, Aug. 2011, 8 Pages.

Belden, "How Cable Temperature Impacts Cable Reach," Sep. 29, 2017, 2 Pages.

"IEEE 802.3af PoE Powered Device Controllers With Auto-Retry", Texas Instruments, Apr. 2008, 28 Pages.

International Preliminary Report on Patentability for International Application No. PCT/US2018/032250, dated Dec. 5, 2019, 09 Pages.

International Search Report and Written Opinion for International Application No. PCT/US2018/032250, dated Jul. 20, 2018, 12 Pages.

NCP1095, "PoE-PD Interface Controller, IEEE 802.3bt," Jun. 2019, 17 Pages.

Tuenge, et al., "PoE Lighting System Energy Reporting Study Part 1," https://www.energy.gov/sites/prod/files/2017/04/f34/2017-02%20ssl-poe_part1_0r.pdf, Feb. 2017, 66 Pages.

Planet, "24-Port Gigabit 60W Ultra PoE Managed Injector Hub (800 watts)," UPOE-2400G, Jan. 2016, 7 Pages.

https://www.fischerconnectors.com/us/en/products/fiberoptic.

http://www.strantech.com/products/tfoca-genx-hybrid-2x2-fiber-optic-copper-connector/.

http://www.qpcfiber.com/product/connectors/e-link-hybrid-connector/.

https://www.lumentum.com/sites/default/files/technical-library-items/poweroverfiber-tn-pv-ae_0.pdf.

"Network Remote Power Using Packet Energy Transfer", Eaves et al., www.voltserver.com, Sep. 2012.

Product Overview, "Pluribus VirtualWire Solution", Pluribus Networks, PN-PO-VWS-05818, https://www.pluribusnetworks.com/assets/Pluribus-VirtualWire-PO-50918.pdf, May 2018, 5 pages.

Implementation Guide, "Virtual Chassis Technology Best Practices", Juniper Networks, 8010018-009-EN, Jan. 2016, https://wwwjuniper.net/us/en/local/pdf/implementation-guides/8010018-en.pdf, 29 pages.

Yencheck, Thermal Modeling of Portable Power Cables, 1993.

Zhang, Machine Learning-Based Temperature Prediction for Runtime Thermal Management across System Components, Mar. 2016.

Data Center Power Equipment Thermal Guidelines and Best Practices.

(56) References Cited

OTHER PUBLICATIONS

Dynamic Thermal Rating of Substation Terminal Equipment by Rambabu Adapa, 2004.
Chen, Real-Time Termperature Estimation for Power MOSEFETs Conidering Thermal Aging Effects:, IEEE Trnasactions on Device and Materials Reliability, vol. 14, No. 1, Mar. 2014.
Heat Concerns When Powering a Power Over Ethernet (PoE) Device, 11 pages, Apr. 21, 2020 (Year: 2020).
Protecting Your IP Traffic from the heat and noise of high-power POE, Mar. 28, 2017, 18 pages (Year: 2017).
Jason Tuenge, POE Lighting System Energy Reporting Study Part 1, 66 pages, Feb. 2017 (Year: 2017).
Power Over Ethernet with Panduit Copper Cabling, 8 pages, 2018 (Year: 2018).
Bill Giovino (Develop the Right Power Over Ethernet System for Industrial LED Smart Lighting, Jun. 11, 2018). (Year: 2018).
Ron Tellas (the time to prepare for 100W power over Ethernet is now) 2018, Belden Inc (Year: 2018).
Power Over Ethernet—The Story So Far, 9 pages, 2019 (Year: 2019).
Jingquan Chen et al: "Buck-boost PWM converters having two independently controlled switches", 32nd Annual IEEE Power Electronics Specialists Conference. PESC 2001. Conference Proceedings, Vancouver, Canada, Jun. 17-21, 2001; [Annual Power Electronics Specialists Conference], New York, NY: IEEE, US, vol. 2,Jun. 17, 2001 (Jun. 17, 2001), pp. 736-741, XP010559317, DOI: 10.1109/PESC.2001.954206, ISBN 978-0-7803-7067-8 paragraph [SectionII]; figure 3.
Cheng K W E et al: "Constant Frequency, Two-Stage Quasiresonant Convertor", IEE Proceedings B. Electrical Power Applications, 1271980 1, vol. 139, No. 3, May 1, 1992 (May 1, 1992), pp. 227-237, XP000292493, the whole document.
Petition for Post Grant Review of U.S. Pat. No. 10,735,105 [Public], filed Feb. 16, 2021, PGR 2021-00055.
Petition for Post Grant Review of U.S. Pat. No. 10,735,105 [Public], filed Feb. 16, 2021, PGR 2021-00056.
Eaves, S. S., Network Remote Powering Using Packet Energy Transfer, Proceedings of IEEE International Conference on Telecommunications Energy (INTELEC) 2012, Scottsdale, AZ, Sep. 30-Oct. 4, 2012 (IEEE 2012) (EavesIEEE).
Edelstein S., Updated 2016 Tesla Model S also gets new 75-kWhbattery option, (Jun. 19, 2016), archived Jun. 19, 2016 by Internet Archive Wayback machine at https://web.archive.org/web/20160619001148/https://www.greencarre.ports.com/news/1103 782_updated-2016-tesla-model-s-also-gets-new-7 5-kwh-battery-option ("Edelstein").
NFPA 70 National Electrical Code, 2017 Edition (NEC).
International Standard IEC 62368-1 Edition 2.0 (2014), ISBN 978-2-8322-1405-3 ("IEC-62368").
International Standard IEC/TS 60479-1 Edition 4.0 (2005), ISBN 2-8318-8096-3 ("IEC-60479").
International Standard IEC 60950-1 Edition 2.2 (2013), ISBN 978-2-8322-0820-5 ("IEC-60950").
International Standard IEC 60947-1 Edition 5.0 (2014), ISBN 978-2-8322-1798-6 ("IEC-60947").
Tanenbaum, A. S., Computer Networks, Third Edition (1996) ("Tanenbaum").
Stallings, W., Data and Computer Communications, Fourth Edition (1994) ("Stallings").
Alexander, C. K., Fundamentals of Electric Circuits, Indian Edition (2013) ("Alexander").
Hall, S. H., High-Speed Digital System Design, A Handbook of Interconnect Theory and Design Practices (2000) ("Hall").
Sedra, A. S., Microelectronic Circuits, Seventh Edition (2014) ("Sedra").
Lathi, B. P., Modem Digital and Analog Communication Systems, Fourth Edition (2009) ("Lathi").
Understanding 802.3at PoE Plus Standard Increases Available Power (Jun. 2011) ("Microsemi").

* cited by examiner

FIGURE 7

| Port | Automatically Gathered Data | | | | Manual Entry | | Calculations | | |
|---|---|---|---|---|---|---|---|---|---|
| | Vpsc (V) | Iport (mA) | Pport (W) | Vpd (V) | TDR (m) | Cable AWG | Cable Temp Rating | Bundle | Pcables (W) | Thermal Rise (°C) | Cable Thermal Status |
| 1 | 53.7 | 0.976 | 52.39 | 53.3 | 10 | 24 | 60 | A | 0.42 | 3.7 | |
| 2 | 53.7 | 0.740 | 39.76 | 53.0 | 20 | 24 | 60 | A | 0.88 | 2.4 | |
| 3 | 53.7 | 0.754 | 40.49 | 52.7 | 30 | 24 | 60 | A | 0.75 | 3.5 | |
| 4 | 53.7 | 1.046 | 56.19 | 51.9 | 40 | 24 | 60 | A | 1.93 | 4.1 | |
| 5 | 53.7 | 0.763 | 40.97 | 52.0 | 50 | 24 | 60 | A | 1.28 | 2.6 | |
| 6 | 53.7 | 1.461 | 78.46 | 53.3 | 10 | 22 | 60 | B | 0.60 | 7.1 | |
| 7 | 53.7 | 1.162 | 62.38 | 53.0 | 20 | 22 | 60 | B | 0.76 | 4.9 | |
| 8 | 53.7 | 1.245 | 66.82 | 52.7 | 30 | 22 | 60 | B | 1.29 | 5.4 | |
| 9 | 53.7 | 1.292 | 69.38 | 52.3 | 40 | 22 | 60 | B | 1.87 | 5.8 | |
| 10 | 53.7 | 0.883 | 50.66 | 51.8 | 50 | 22 | 60 | A | 1.96 | 3.5 | |
| 11 | 53.7 | 1.351 | 72.57 | 51.5 | 60 | 22 | 60 | A | 2.56 | 6.3 | |
| 12 | 53.7 | 1.788 | 96.0 | 49.0 | 60 | 24 | 60 | A | 8.44 | 10.1 | |
| 13 | 53.7 | 0.953 | 51.19 | 52.2 | 60 | 24 | 60 | B | 2.40 | 3.8 | |
| 14 | 53.7 | 1.313 | 70.5 | 51.5 | 60 | 22 | 60 | B | 2.90 | 6.0 | |
| 15 | 53.7 | 1.233 | 66.2 | 51.6 | 60 | 22 | 60 | B | 2.55 | 5.4 | |
| 16 | 53.7 | 1.309 | 70.27 | 51.5 | 70 | 24 | 60 | A | 2.88 | 5.9 | |
| 17 | 53.7 | 1.003 | 53.86 | 50.6 | 80 | 24 | 60 | A | 3.10 | 3.9 | |
| 18 | 53.7 | 0.720 | 38.66 | 51.2 | 90 | 24 | 60 | A | 1.77 | 2.3 | |
| 19 | 53.7 | 0.976 | 52.43 | 49.8 | 90 | 22 | 60 | A | 3.77 | 3.7 | |
| 20 | 53.7 | 1.810 | 97.2 | 45.7 | 100 | 22 | 60 | A | 18.42 | 10.3 | |
| 21 | 53.7 | 1.395 | 74.93 | 51.0 | 70 | 22 | 60 | B | 3.62 | 6.6 | |
| 22 | 53.7 | 1.153 | 61.91 | 53.1 | 80 | 22 | 60 | B | 2.98 | 4.8 | |
| 23 | 53.7 | 1.468 | 78.83 | 50.0 | 90 | 22 | 60 | B | 5.43 | 7.2 | |
| 24 | 53.7 | 1.615 | 86.72 | 49.2 | 100 | 22 | 60 | B | 7.38 | 8.5 | |

FIGURE 8

| Port | Vpse (V) | Iport (mA) | Pport (W) | Vpd (V) | TDR (m) | Cable AWG | Bundle | Pcable (W) | Thermal Rise (°C) | Cable Thermal Status |
|---|---|---|---|---|---|---|---|---|---|---|
| 1 | 53.7 | 0.873 | 46.9 | 53.3 | 10 | 24 | A | 0.34 | 3.1 | |
| 2 | 53.7 | 1.080 | 58.02 | 52.7 | 20 | 24 | A | 1.03 | 4.3 | |
| 3 | 53.7 | 1.089 | 58.48 | 52.3 | 30 | 24 | A | 1.57 | 4.4 | |
| 4 | 53.7 | 1.009 | 54.17 | 51.9 | 40 | 24 | A | 1.79 | 3.9 | |
| 5 | 53.7 | 1.094 | 58.74 | 51.3 | 50 | 24 | A | 2.63 | 4.4 | |
| 6 | 53.7 | 1.467 | 78.23 | 53.3 | 10 | 22 | B | 0.59 | 7.1 | |
| 7 | 53.7 | 1.652 | 88.73 | 52.8 | 20 | 22 | B | 1.53 | 6.8 | |
| 8 | 53.7 | 1.453 | 78.04 | 52.5 | 30 | 22 | B | 1.77 | 7.1 | |
| 9 | 53.7 | 1.128 | 60.55 | 52.4 | 40 | 22 | B | 1.42 | 4.6 | |
| 10 | 53.7 | 0.800 | 42.96 | 51.9 | 50 | 24 | A | 1.41 | 2.7 | |
| 11 | 53.7 | 1.268 | 68.09 | 51.9 | 60 | 22 | B | 2.25 | 5.6 | |
| 12 | 53.7 | 1.788 | 96 | 49.0 | 60 | 24 | A | 6.44 | 10.1 | |
| 13 | 53.7 | 0.907 | 48.71 | 51.3 | 80 | 24 | B | 2.17 | 3.3 | |
| 14 | 53.7 | 1.458 | 78.27 | 51.3 | 70 | 22 | B | 3.57 | 7.1 | |
| 15 | 53.7 | 1.123 | 60.29 | 51.8 | 60 | 22 | B | 2.11 | 4.6 | |
| 16 | 53.7 | 1.619 | 86.94 | 51.0 | 70 | 24 | A | 9.40 | 8.5 | |
| 17 | 53.7 | 0.699 | 37.55 | 51.5 | 80 | 24 | A | 1.51 | 2.3 | |
| 18 | 53.7 | 0.875 | 46.97 | 50.6 | 90 | 24 | A | 2.09 | 3.1 | |
| 19 | 53.7 | 0.622 | 33.38 | 51.2 | 100 | 24 | A | 1.53 | 1.9 | |
| 20 | 53.7 | 1.810 | 97.2 | 45.7 | 100 | 24 | A | 14.40 | 10.3 | |
| 21 | 53.7 | 1.513 | 81.27 | 50.7 | 70 | 22 | B | 4.49 | 7.6 | |
| 22 | 53.7 | 1.461 | 78.43 | 50.4 | 80 | 22 | B | 4.78 | 7.1 | |
| 23 | 53.7 | 1.222 | 65.62 | 50.6 | 90 | 22 | B | 3.76 | 5.3 | |
| 24 | 53.7 | 1.595 | 85.64 | 49.2 | 100 | 22 | B | 7.12 | 8.3 | |

90 — Automatically Gathered Data / Calculation

FIGURE 9

| Port | Vpse (V) | Iport (A) | Pport (W) | Vpd (V) | TDR (m) | Cable AWG | Cable Temp Rating | Bundle | Pcable (W) | Thermal Rise (°C) | Cable Thermal Status |
|---|---|---|---|---|---|---|---|---|---|---|---|
| 1 | 380 | 0.892 | 339 | 332.5 | 1211 | 24 | 60 | A | 42.41 | 3.2 | |
| 2 | 380 | 1.534 | 583 | 278.8 | 1499 | 24 | 60 | A | 155.25 | 7.8 | |
| 3 | 380 | 1.179 | 448 | 336.3 | 842 | 24 | 60 | A | 51.49 | 5.0 | |
| 4 | 380 | 1.055 | 401 | 354.9 | 541 | 24 | 60 | A | 26.51 | 4.2 | |
| 5 | 380 | 1.153 | 438 | 307.4 | 1432 | 24 | 60 | A | 83.71 | 4.8 | |
| 6 | 380 | 1.361 | 517 | 335.6 | 1165 | 22 | 60 | B | 60.38 | 6.3 | |
| 7 | 380 | 1.455 | 553 | 327.9 | 1279 | 22 | 60 | B | 75.84 | 7.1 | |
| 8 | 380 | 1.945 | 739 | 311.3 | 1262 | 22 | 60 | B | 133.64 | 11.7 | |
| 9 | 380 | 2.353 | 894 | 286.7 | 1416 | 22 | 60 | B | 219.45 | 16.5 | |
| 10 | 380 | 0.871 | 331 | 348.4 | 824 | 24 | 60 | A | 27.51 | 3.1 | |
| 11 | 380 | 1.416 | 538 | 320.9 | 1490 | 22 | 60 | B | 83.63 | 6.8 | |
| 12 | 380 | 1.553 | 590 | 303.1 | 1125 | 24 | 60 | A | 119.33 | 7.9 | |
| 13 | 380 | 0.989 | 376 | 334.9 | 1036 | 24 | 60 | A | 44.63 | 3.8 | |
| 14 | 380 | 2.163 | 822 | 313.1 | 1105 | 22 | 60 | B | 144.78 | 14.2 | |
| 15 | 380 | 2.137 | 812 | 326.0 | 902 | 22 | 60 | B | 115.32 | 13.9 | |
| 16 | 380 | 2.058 | 782 | 349.6 | 527 | 22 | 60 | B | 62.49 | 13.0 | |
| 17 | 380 | 1.497 | 569 | 316.9 | 958 | 24 | 60 | A | 94.51 | 7.4 | |
| 18 | 380 | 1.584 | 602 | 315.7 | 923 | 24 | 60 | A | 101.92 | 8.2 | |
| 19 | 380 | 1.400 | 532 | 290.9 | 1446 | 24 | 60 | A | 124.70 | 6.6 | |
| 20 | 380 | 0.855 | 325 | 336.7 | 1150 | 24 | 60 | A | 37.01 | 3.0 | |
| 21 | 380 | 1.982 | 753 | 317.8 | 1121 | 22 | 60 | B | 123.25 | 12.1 | |
| 22 | 380 | 1.324 | 503 | 325.1 | 1481 | 22 | 60 | B | 72.66 | 6.0 | |
| 23 | 380 | 2.203 | 837 | 326.4 | 869 | 22 | 60 | B | 118.05 | 14.7 | |
| 24 | 380 | 1.982 | 753 | 316.0 | 1153 | 22 | 60 | B | 126.77 | 12.1 | |

FIGURE 12

SAFETY MONITORING FOR CABLES TRANSMITTING DATA AND POWER

STATEMENT OF RELATED APPLICATIONS

The present application is a divisional of U.S. patent application Ser. No. 16/696,834, filed Nov. 26, 2019, entitled SAFETY MONITORING FOR CABLES TRANSMITTING DATA AND POWER, which is a continuation-in-part of U.S. patent application Ser. No. 15/604,344, entitled THERMAL MODELING FOR CABLES TRANSMITTING DATA AND POWER, filed on May 24, 2017. These applications are incorporated herein by reference in their entirety.

TECHNICAL FIELD

The present disclosure relates generally to communications networks, and more particularly, to safety monitoring for cables transmitting data and power.

BACKGROUND

Communications cables that are used to deliver higher power may encounter self-heating and variation due to a combination of currents carried in the cables, how the cables are installed (e.g., cable bundling, horizontal or vertical direction), and what type of cables are used.

BRIEF DESCRIPTION OF THE DRAWINGS

FIG. 7 illustrates an example of a risk assessment table providing cable thermal status, in accordance with one embodiment.

FIG. 8 illustrates an example of a risk assessment table providing cable thermal status, in accordance with another embodiment.

FIG. 9 illustrates an example of a risk assessment table providing cable thermal status, in accordance with another embodiment.

FIG. 12 illustrates an example of a risk assessment table providing thermal status for a higher power system operation, in accordance with one embodiment.

Corresponding reference characters indicate corresponding parts throughout the several views of the drawings.

DESCRIPTION OF EXAMPLE EMBODIMENTS

Overview

Figure 1A:
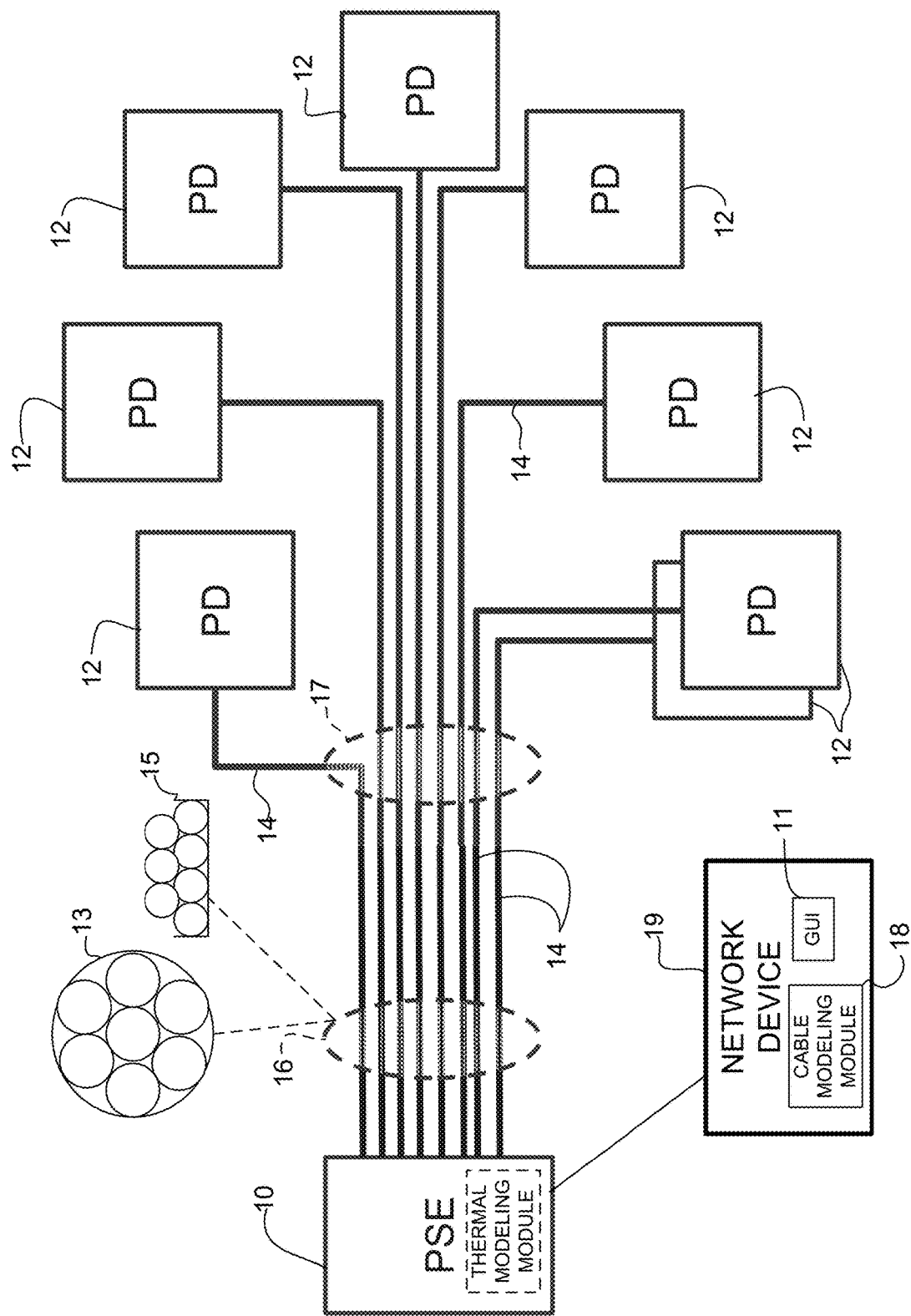
FIG. 1A illustrates an example of a network in which embodiments described herein may be implemented.

In one embodiment, a method generally comprises monitoring real-time electrical data for Power Sourcing Equipment (PSE) transmitting power over a cable to a Powered Device (PD), and identifying changes in the real-time electrical data indicating strain on one or more wires in the cable due to stretching in the wires.

In one or more embodiments, a time domain reflectometer is used to identify variations in impedance over a length of the cable to indicate the stretching in the wires.

In one or more embodiments, the stretching comprises a localized reduction in diameter of the wires over time along a vertical portion of the cable.

In one or more embodiments, the real-time electrical data is used to calculate thermal characteristics for the cable and the method further comprises periodically updating the thermal characteristics based on the monitored data.

In one or more embodiments, the power comprises multi-phase pulse power and the monitored data comprises voltage and current for each phase.

In one or more embodiments, the method further comprises identifying a wire gauge of the cable based on the data.

In one or more embodiments, the method further comprises measuring cable length using a time domain reflectometer, wherein the cable length is used to calculate a wire gauge.

In one or more embodiments, the method further comprises detecting an adjacent cable by measuring cross-talk between wires in the cables.

In one or more embodiments, the power comprises pulse power and cross-talk is measured during a transition of a pulse of the pulse power.

In one or more embodiments, the method further comprises measuring a high frequency signal at a receiver at the PD to indicate the stretching within.

In one or more embodiments, the method further comprises identifying a thermal rise at the cable and limiting power output at a port of the PSE connected to the cable.

In one or more embodiments, the method further comprises identifying a percentage of stretch over a specified threshold and limiting power output at a port of the PSE connected to the cable.

In one or more embodiments, the method further comprises identifying a percentage of stretch over a specified threshold level and sending a notification.

In another embodiment, a method generally comprises monitoring real-time electrical data at Power Sourcing Equipment (PSE) transmitting power over a cable to a Powered Device (PD), calculating thermal characteristics for the cable based on the monitored data, and periodically updating the thermal characteristics based on the monitored data. The power comprises multi-phase pulse power, the data comprises voltage and current measured for each phase of the multi-phase pulse power, and the voltage is greater than 60 volts at the PSE.

In yet another embodiment, a method comprises monitoring real-time electrical data at Power Sourcing Equipment (PSE) transmitting power over a cable to a Powered Device (PD), wherein the power comprises pulse power, monitoring cross-talk between wires within the cable and an adjacent cable to identify cable adjacency, performing thermal modeling on the cable, and calculating a thermal rise on the cable based at least in part on the identified cable adjacency.

Further understanding of the features and advantages of the embodiments described herein may be realized by reference to the remaining portions of the specification and the attached drawings.

Example Embodiments

The following description is presented to enable one of ordinary skill in the art to make and use the embodiments. Descriptions of specific embodiments and applications are provided only as examples, and various modifications will be readily apparent to those skilled in the art. The general principles described herein may be applied to other applications without departing from the scope of the embodiments. Thus, the embodiments are not to be limited to those shown, but are to be accorded the widest scope consistent with the principles and features described herein. For purpose of clarity, details relating to technical material that is known in the technical fields related to the embodiments have not been described in detail.

In systems used to simultaneously transmit power and data communications (e.g., Power over Ethernet (PoE), Power over Fiber (PoF), higher power PoE, Extended Safe Power (ESP), and the like), cable heating may degrade the reliability of the communications signals that are carried over the cables and damage the cable plant. Cable plant damage is often a direct result of thermal stress occurring in unattended or non-visible locations. In some cases, powered devices may still operate on a thermally stressed cable with uncertain operation, thereby leaving a user confused as to how to debug the system. High temperatures may also lead to higher power costs due to more power dissipated in the cables. In conventional systems, visible inspection may be needed to comply with standards (e.g., NEC (National Electrical Code), IEEE (Institute of Electrical and Electronics Engineers) 802.3) and determine the operational ability of the cable plant between the power source equipment and the powered devices. Many instances of failure may be missed or ignored. As PoE standards allow for higher power transmissions, temperature concerns are expected to become more prevalent.

The embodiments described herein provide safety monitoring of cables that are used to carry data and power simultaneously. As described in detail below, safety monitoring may include thermal modeling of cables and monitoring of cables for degradation or variation due to strain on wires (e.g., stretching in vertical installations). Real-time electrical measurements provide an accurate and up-to-date analysis of a cable plant health assessment. The embodiments may be used, for example, to identify power and thermal impact due to self-heating and provide alerts for possible over heat conditions. One or more embodiments may be used to limit power output based on the modeling or prevent modes that may result in unwanted cable behavior such as heat damage to the cable or other unintended consequences. As described in detail below, one or more embodiments may collect cable heating factors (e.g., current carried in cable, cable type, cable installation, etc.) and use this data to model expected temperature rises and other health assessment characteristics in the cables to determine if the cable can handle the power level and if the integrity of the data carried across the cable is at risk.

In one or more embodiments, the cables may deliver power at a power level higher than used in conventional PoE. For example, power may be delivered at a power level greater than 100 W and in some cases greater than 1000 W. In one or more embodiments, power may be delivered as pulse power. The term "pulse power" as used herein refers to power that is delivered in a sequence of pulses in which the voltage varies between a very small voltage (e.g., close to 0V (volts), 3V) during a pulse off interval and a larger voltage (e.g., $\geq 12V$, $\geq 24V$) during a pulse on interval. High voltage pulse power (e.g., >56V, $\geq 60V$, $\geq 300V$) may be transmitted from power sourcing equipment (PSE) to a powered device (PD) for use in powering the powered device, as described, for example, in U.S. patent application Ser. No. 16/671,508, ("Initialization and Synchronization for Pulse Power in a Network System"), filed Nov. 1, 2019, which is incorporated herein by reference in its entirety.

In one or more embodiments, the pulse power may be transmitted in multiple phases in a multi-phase pulse power system. For example, one or more embodiments may use multiple phase (multi-phase) pulse power to achieve less loss, with continuous uninterrupted power to the output with overlapping phase pulses to a powered device, as described in U.S. patent application Ser. No. 16/380,954 ("Multiple Phase Pulse Power in a Network Communications System"), filed Apr. 10, 2019, which is incorporated herein by reference in its entirety. As described in detail below, multiple phases of voltage pulses may be delivered over a multi-phase cable with the pulses in each phase offset from pulses in other phases. Multiple pair cabling may be used, for example, with a DC pulse on each pair, timed in such a manner as to provide approximately 100% net duty cycle continuous power at the powered device (or load).

Referring now to the drawings, and first to FIG. 1A, an example of a network in which embodiments described herein may be implemented is shown. The embodiments operate in the context of a data communications network including multiple network devices. The network may include any number of network devices in communication via any number of nodes (e.g., routers, switches, gateways, controllers, or other network devices), which facilitate passage of data within the network. The network devices may communicate over or be in communication with one or more networks (e.g., local area network (LAN), metropolitan area network (MAN), wide area network (WAN), virtual private network (VPN) (e.g., Ethernet virtual private network (EVPN), layer 2 virtual private network (L2VPN)), virtual local area network (VLAN), enterprise network, corporate network, data center, Internet, intranet, or any other network).

The network may be configured for Power over Ethernet (PoE), Power over Fiber (PoF), advanced power over data, ESP (Extended Safe Power) (e.g., delivery of pulse power with fault detection and safety protection), multi-phase pulse power, or any other power over communications cable system that is used to pass electric power along with data to allow a single cable to provide both data connectivity and electric power to network devices such as wireless access points, IP (Internet Protocol) cameras, VoIP (Voice over IP) phones, video cameras, point-of-sale devices, security access control devices, residential devices, building automation, industrial automation, and many other devices. In one or more embodiments, signals may be exchanged among communications equipment and power transmitted from power sourcing equipment to powered devices. The power may be transmitted in a network system (e.g., network communications system) with or without communications. In one or more embodiments, the network is configured to transmit pulse power over the cable.

As shown in the simplified example of FIG. 1A, the network may include a Power Sourcing Equipment device (PSE) 10 in communication with any number of Powered Devices (PDs) 12 via cables 14. The PSE may be a network device such as a router, switch, or central hub that provides (sources) power on the cable 14. The PSE 10 may be configured to delivery power at one or more output levels (e.g., programmable PoE). The network may include any number of PSEs 10 in communication with any number of PDs 12. The PD 12 is powered by the PSE 10 and consumes energy. The PD 12 may be any network device powered by the power transmitted by the PSE. The PD 12 may be, for example, a switch, router, IP device, or any other device and may be configured to operate at one or more power levels. The network device may also operate as both a PD and PSE, as described below with respect to FIG. 1B.

The cables 14 are configured to transmit both power and data from the PSE 10 to the PDs 12 (FIG. 1A). The cables 14 may be formed from any material suitable to carry both power and data (e.g., copper, fiber). The cable may include any number of wires or wire pairs. For example, the cable may include a single wire pair (single twisted pair, single balanced copper wire pair, single wire pair Ethernet) located in a single pair cable (e.g., SPE, Base-T1 Ethernet) or any number of wire pairs located in a multi-pair cable (e.g., two-pair cable, four-pair cable, Base-T Ethernet). The multi-pair cable may comprise multiple instances of single wire pairs (e.g., SPE, PoDL) in parallel or multiple wire pairs connected between a pair center tap (e.g., PoE), or any other configuration including high power configurations (e.g., ESP). The cables 14 may comprise, for example Catx cable (e.g., category 5, category 5e, category 6, etc.) and may be twisted pair (e.g., four pair, SPE (Single Pair Ethernet)) Ethernet cabling, or any other type of cable.

The cables 14 may extend between the PSE 10 and PDs 12 at a distance, for example, of 10 meters, 100 meters, or any other length. The cables 14 may be arranged in any configuration. For example, the cables 14 may be bundled together in one or more groups 13 or stacked in one or more groups 15 as shown schematically in cross-section in FIG. 1A. Any number of cables 14 may be bundled together. The cables 14 may have a round, flat, oval, or any other cross-sectional shape and may include any number or type of conductors (e.g., solid or stranded wires). The cables 14 may be bundled together at one location 16 while not bundled together at another location 17, for example.

The cable 14 may be rated for one or more power levels, a maximum power level, a maximum temperature, or identified according to one or more categories indicating acceptable power level usage, for example. In one example, the cables 14 correspond to a standardized wire gauge system such as AWG (American Wire Gauge). For different gauge wire, AWG provides data including diameter, area, resistance per length, ampacity (maximum amount of current a conductor can carry before sustaining immediate or progressive deterioration), and fusing current (how much current it takes to melt a wire in free air). Various other standards (e.g., NEC (National Electrical Code), UL (Underwriters Laboratories)) may be used to provide various requirements for the cable and cable system and provide temperature ratings or limits, or other information. This data may be stored in a thermal modeling system for reference in providing a cable thermal status, as described below.

As noted above, the cables 14 may encounter self-heating. For example, when power is added to twisted-pair cables, the copper conductors generate heat and temperatures rise. A thermal modeling module 18 is configured to model the thermal impact due to self-heating. In one or more embodiments, the thermal modeling module 18 is located at a network device 19, which may be located at a Network Operations Center (NOC), for example. The network device 19 may comprise, for example, a network management station, controller, computer, or any other device. The network device 19 is in communication with the PSE 10 and may also communicate with one or more PDs 12 directly or through the PSE. The thermal modeling module 18 (e.g., code, software, logic, firmware, application, client, appliance, hardware, device, element) may also be distributed across any number of network devices or operate in a cloud environment. Also, the thermal modeling module 18 or one or more components of the module may be located at the PSE 10, as shown in FIG. 1A.

The PSE 10 may measure one or more variables used for thermal modeling calculations at the PSE or at the network device 19. For example, the PSE 10 may measure cable length using a TDR (Time Domain Reflectometer), output voltage at PSE, and current (e.g., for individual conductors). In one or more embodiments, the PSE 10 may also collect intelligent PD available statistics for reporting input voltage at the PD. One or more calculations may be made at the PSE 10 or at the remote network device 19 based on measurements made at the PSE.

The thermal modeling module 18 may collect data including, for example, cable AWG, real-time current carried in the conductors of the cables (nominal or maximum current), voltage (output at PSE, input at PD), cable length, cable segment length, number of PSE ports, cable proximity to other cables carrying currents that can act as localized heat sources, maximum expected ambient temperature where cables are routed, maximum temperature rating of the cable, temperature at PD, or any combination of this data or other data. Various measurements may be used to gather real-time data and user input may also be provided for one or more parameters (e.g., cable type, cable installation configuration, number of ports) if not available. The thermal modeling module 18 may use this data to determine the operational maximum power (maximum safe available power for delivery on the PSE port), thermal characteristics (real-time temperature rise in cables), overall health of an end-to-end cable 14, a bundle of those end-to-end cables, and a bundle encompassing bundles of cable bundles, and if a cable is safe for operation by the attached PD 12.

As described in detail below, the cable modeling module 18 may calculate real-time localized heating in a cable plant and generate a cable plant risk assessment (e.g., spreadsheet, graphical image) and alarm states to minimize unsafe operation. In one or more embodiments, the cable modeling module 18 may provide an alarm state or syslog (system log) message, as well as prevent delivery of more power than is safely determined for a particular cable. For example, the cable modeling module 18 may warn a user of potential heating issues and power concerns that may compromise the cable plant, data integrity of the communications channel, and PD operation.

In one or more embodiments, the network device 19 may include a GUI (Graphical User Interface) 11 for receiving user input and presenting results of the thermal modeling to the user. As described below, the GUI 11 may be used to display a risk assessment table or graphical image indicating the thermal rise, health status, or other information about the cables and cable plant.

Figure 1B:
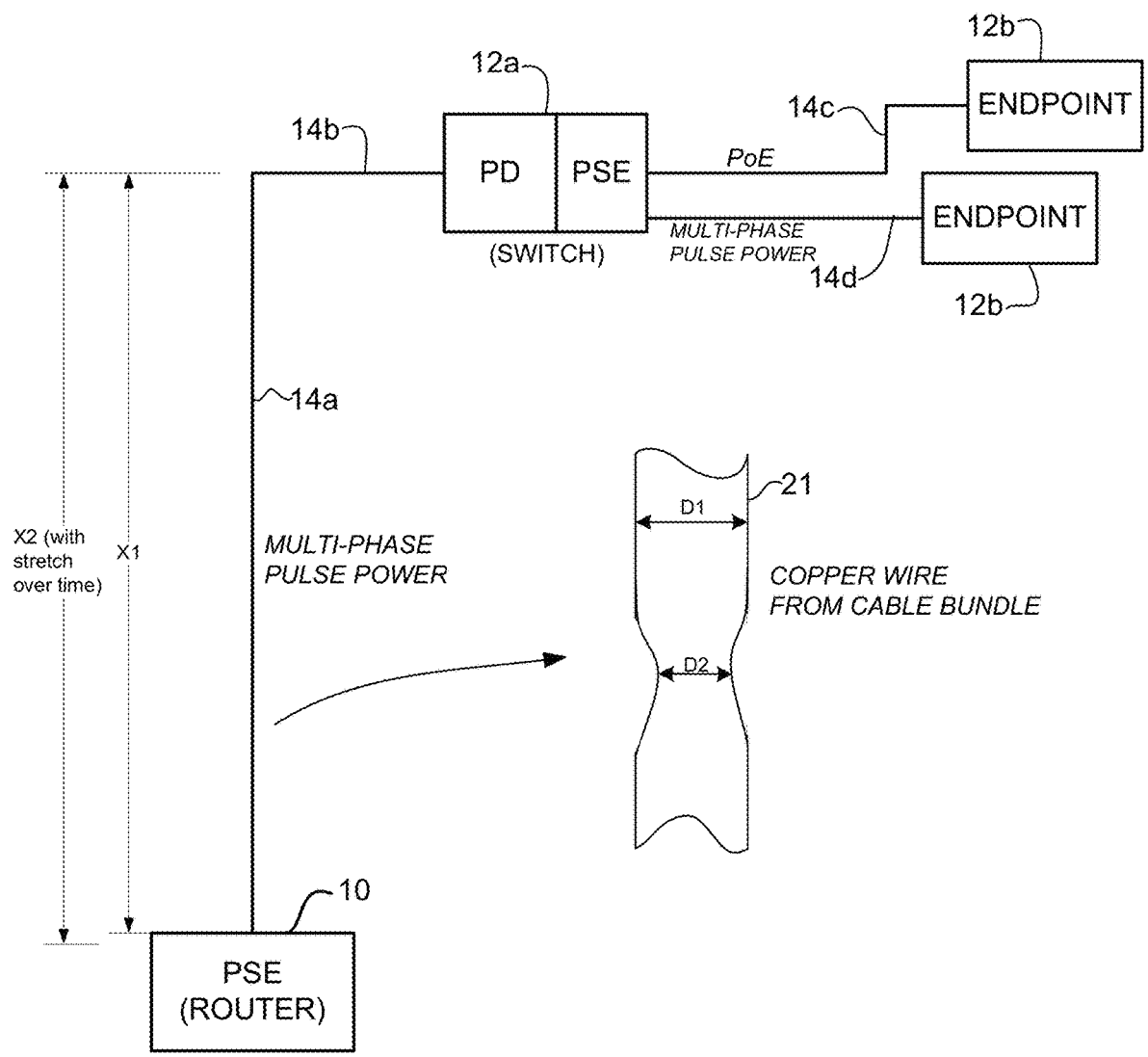
FIG. 1B is a schematic illustrating a simplified example of cable installation in a network.

FIG. 1B is a simplified schematic illustrating an example of cable routing in a network. As shown in FIG. 1B, a network device (e.g., switch) 12*a* may operate as a PD and PSE, receiving power from a PSE (e.g., router 10) and transmitting power to one or more PDs or endpoints 12*b*, 12*c*. In the example shown in FIG. 1B, the PSE 10 transmits power over cable 14*a*, 14*b* to a switch 12*a*, which transmits conventional PoE over cable 14*c* and ESP (e.g., multi-phase pulse power) over cable 14*d*. In this example, the cable between network devices 10 and 12*a* comprises a vertical section 14*a* and a horizontal section 14*b*. Cables that run vertically may be susceptible to stretching overtime due to the weight of the cable. For example, the cable (one or more conductors or twisted pairs within cable) may start out with vertical length x1 and over time due to the weight of the cable may increase to vertical length x2. There may be localized thinning of the wire 21 as shown at D2 (reduced diameter as compared to D1), for example. As described in detail below, TDR may be used to monitor and detect an area of thinning (stretch of wire 21). For example, impedance at a given point or range in the wire 21 may begin to increase as the wire gets thinner, while an impedance point or range at another section of the wire may begin to decrease as the wire gets thicker. In another example, impedance changes may be identified on the wire 21 given that the source voltage and current, as well as the load voltage and current remain the same. Over time, with all other variables static, the stretching will become apparent. As described below, the stretching may be monitored and identified, and if degradation of the wire due to stretching increases over a specified threshold, a safety notification or alert may be generated. The stretching may also be used in the thermal modeling (e.g., lowering an acceptable thermal rise increase on the stretched wire). It is to be understood that the cable descriptions herein with respect to the cable 14 of FIG. 1A also apply to the cables 14*a*, 14*b*, 14*c*, 14*d* shown in FIG. 1B.

It is to be understood that the network devices and topology shown in FIGS. 1A and 1B, and described above are only examples and the embodiments described herein may be implemented in networks comprising different network topologies or network devices, or using different protocols or cables, without departing from the scope of the embodiments. For example, the network may comprise any number or type of network devices that facilitate passage of data over the network (e.g., routers, switches, gateways, controllers), network elements that operate as endpoints or hosts (e.g., servers, virtual machines, clients), and any number of network sites or domains in communication with any number of networks. Thus, network nodes may be used in any suitable network topology, which may include any number of servers, virtual machines, switches, routers, or other nodes interconnected to form a large and complex network, which may include cloud or fog computing. Nodes may be coupled to other nodes or networks through one or more interfaces employing any suitable wired or wireless connection, which provides a viable pathway for electronic communications.

Figure 2:
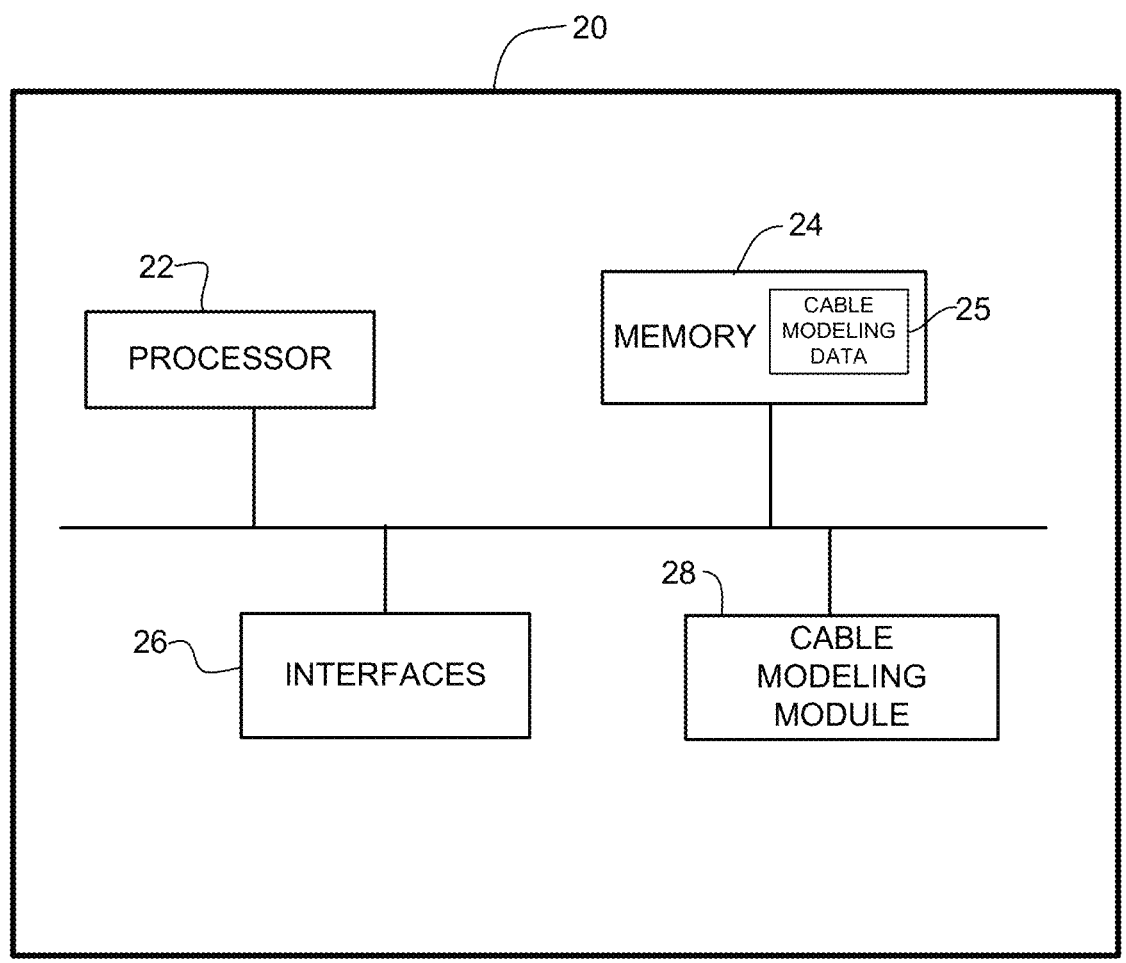
FIG. 2 depicts an example of a network device useful in implementing embodiments described herein.

FIG. 2 illustrates an example of a network device 20 that may be used to implement the embodiments described herein. In one embodiment, the network device 20 is a programmable machine that may be implemented in hardware, software, or any combination thereof. The network device 20 includes one or more processors 22, memory 24, network interface (port) 26, and cable modeling module 28.

Memory 24 may be a volatile memory or non-volatile storage, which stores various applications, operating systems, modules, and data for execution and use by the processor 22. For example, components of the cable modeling module 28 (e.g., code, logic, firmware, etc.) may be stored in the memory 24. Memory 24 may also store manually input data and monitored data or thermal calculations 25 (e.g., wire gauges and associated cable temperature ratings, measurements, calculated data, or other data, tables, or graphs). The network device 20 may include any number of memory components.

Logic may be encoded in one or more tangible media for execution by the processor 22. For example, the processor 22 may execute codes stored in a computer-readable medium such as memory 24. The computer-readable medium may be, for example, electronic (e.g., RAM (random access memory), ROM (read-only memory), EPROM (erasable programmable read-only memory)), magnetic, optical (e.g., CD, DVD), electromagnetic, semiconductor technology, or any other suitable medium. In one example, the computer-readable medium comprises a non-transitory computer-readable medium. Logic may be used to perform one or more functions described below with respect to the flowchart of FIGS. 3A and 3B. The network device 20 may include any number of processors 22.

The network interface 26 may comprise any number of interfaces (linecards, ports) for receiving data or transmitting data to other devices. The interface may be, for example, an interface at the PSE 10 for transmitting power and data to the PD 12, an interface at the PSE for transmitting measurements, data, or risk assessment information to the network device 19, or an internal interface at the PSE 10 for transmitting data to the thermal modeling module 18 (FIGS. 1A and 2). The network interface 26 may include, for example, an Ethernet interface for connection to a computer or network. The interface 26 may be configured for PoE, PoF, ESP, or similar operation.

It is to be understood that the network device 20 shown in FIG. 2 and described above is only an example and that different configurations of network devices may be used. For example, the network device 20 may further include any suitable combination of hardware, software, algorithms, processors, devices, components, or elements operable to facilitate the capabilities described herein.

Figure 3A:
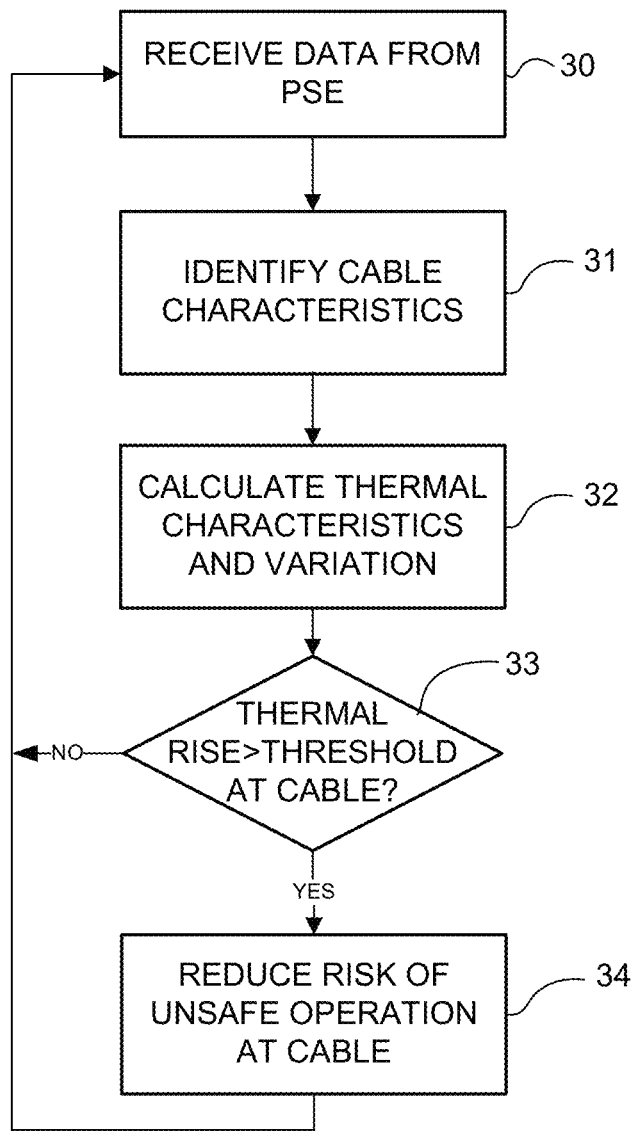
FIG. 3A is a flowchart illustrating an overview of a process for thermal modeling of cables, in accordance with one embodiment.

FIG. 3A is a flowchart illustrating an overview of a process for modeling thermal characteristics of cables used to transmit power and data, in accordance with one embodiment. At step 30, the thermal modeling module 18 receives real-time electrical data (e.g., real-time measurements of relevant parameters) from the PSE 10 (FIGS. 1A and 3A). In one embodiment, data is extracted from the PSE 10, which may include data from the PDs 12. User input may be received if an intelligent PD is not available. The thermal modeling module 18 identifies cable adjacencies and characteristics (step 31). In one embodiment, the PSE 10 may use a TDR to determine the cable length at each port. The thermal modeling module 18 may use voltage, current, and cable length to determine wire gauge using a calculated resistance. If the PD 12 is not able to provide V_in (voltage at PD), the wire gauge may be provided by user input. As described below, cable adjacencies (e.g., arrangement of cables within a bundle, bundle size) may be identified by transmitting a pulse at the PSE 10 and then measuring an E field (pulsed field strength) at surrounding cables 14 to detect adjacent cables. The thermal modeling module 18 may use the wire gauge data, cable adjacencies, and current, voltage, and power data to calculate thermal characteristics for the cables (step 32). The thermal characteristics may include, for example, thermal rise, maximum power, and overall end-to-end cable health. If a thermal rise at one of the cables exceeds a specified threshold (step 33), the thermal modeling module 18 may take action to reduce the risk of unsafe operation at the cable (step 34). This may include, for example, identifying the cable in a risk assessment table, graphical image, alert, alarm, message, or other indication presented to a user, or preventing operation of the port connected to the cable. The thermal modeling module 18 may, for example, generate a table or image to indicate cable health for a selected power level and environment for a cable or bundle of cables, as well as generate alarm states (e.g., lights) and messages (e.g., syslog). The thermal rise may refer to a specific temperature, delta temperature, change in temperature (e.g., percent or increase above a baseline temperature), or a rise in temperature over a period of time.

Figure 3B:
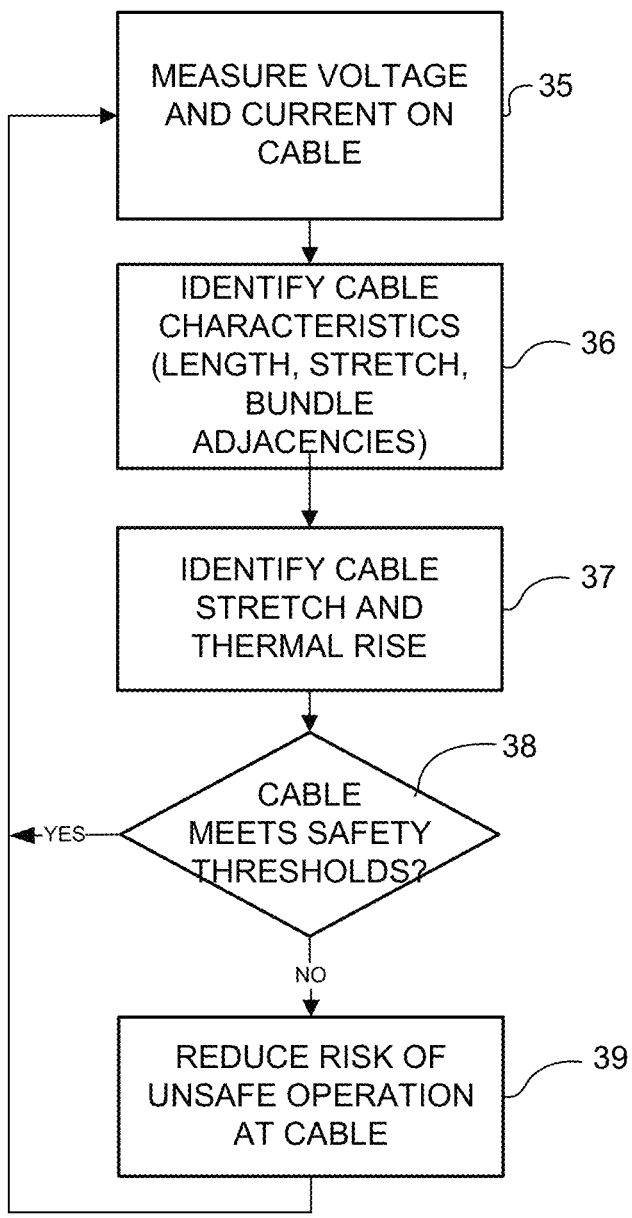
FIG. 3B is a flowchart illustrating details of a process for safety monitoring of cables, in accordance with one embodiment.

FIG. 3B is a flowchart illustrating details for cable safety monitoring in accordance with one embodiment. Real-time electrical data including, for example, voltage and current at the PSE, PD or both PSE and PD, and impedance are measured for the cable (e.g., each wire, each wire pair, each phase) at step 35. Cable characteristics (e.g., cable routing, length, stretch, gauge, bundle adjacencies) are identified (step 36). Thermal characteristics and wire variations (e.g., stretch (thinning)) are calculated (step 37). If the cable does not meet a specified safety threshold (e.g., a thermal rise or stretch at one of the cables exceeds a specified limit) (step 38), the cable modeling module 18 may take action to reduce the risk of unsafe operation at the cable (step 39). As previously described this may include, for example, reducing power output at the PSE or generating a notification or alarm (e.g., illuminate LED at PSE, transmit system warning).

It is to be understood that the processes shown in FIGS. 3A and 3B, and described above are only examples and that steps may be added, removed, or combined, without departing from the scope of the embodiments.

The following provides examples for determining wire gauge, bundle size, and cable adjacencies, and presenting safety data and thermal modeling results to a user.

In one or more embodiments, wire gauge calculations may be made using V_out (voltage at port of PSE), V_in (voltage at PD), I_individual_cable (current of cable), and TDR_m (cable length). In one example, calculations are performed assuming no connector loss. The resistance calculations may be performed as follows:

$$R\_individual\ conductor=(V\_out-V\_in)/I\_individual\ conductor;\ and$$

$$R\_mOhm/m=(R\_individual\_conductor/TDR\_m)\times 1000.$$

R_mOhm/m may be used to determine the AWG for the conductor.

The user may enter the basic wire gauge for the assessment calculations if there is not an intelligent PD to provide V_in.

Figure 4:
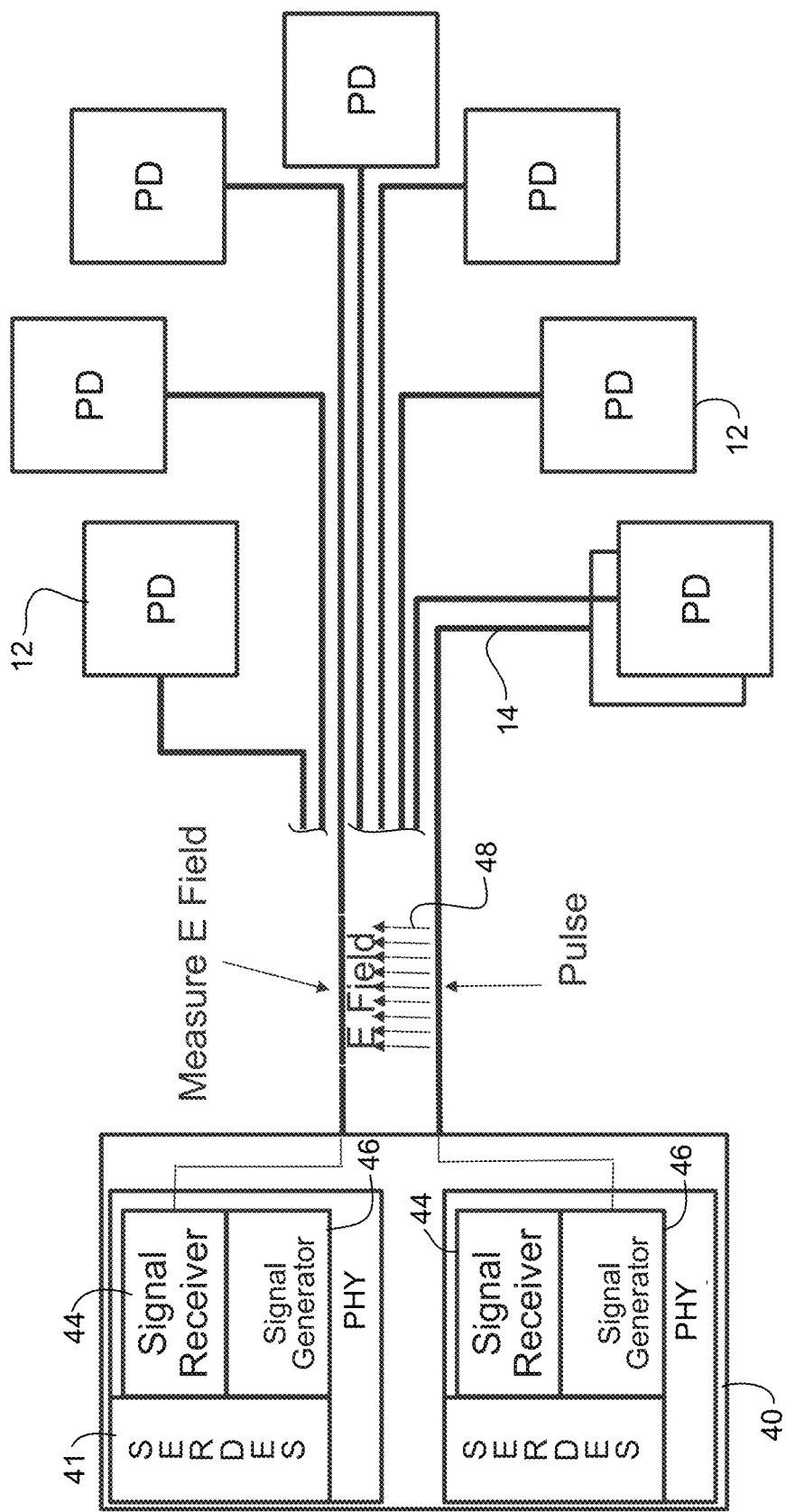
FIG. 4 illustrates detection of cable adjacencies, in accordance with one embodiment.

FIG. 4 illustrates an example of a PSE 40 that may be used to provide measurements for use in automatically calculating cable adjacency. In the example shown in FIG. 4, the PSE 40 includes two PHY (circuitry for physical layer functions) each having a SerDes 41 (Serializer/Deserializer), a signal receiver 44, and a signal generator 46. The PSE 40 may comprise any number of ports and corresponding components. In one embodiment, a 1 MHz (or any other frequency) pulse is transmitted by the signal generator 46. The pulse is used to automatically determine cable to cable proximity by calculating a measured field strength (E Field 48) at the receiver 44. The pulse may be used to track a cable tied to a particular port or switch within a cable bundle referenced to the transmitting port. The pulse may be used, for example within a switch or router during bring up. The 1 MHz pulse cannot be used to determine cable proximity between switches in a network or in a situation wherein a data center is running production traffic and a new switch or new cable plant is added. In this case, a packet pulse generator may be used as shown in FIG. 5.

Figure 5:
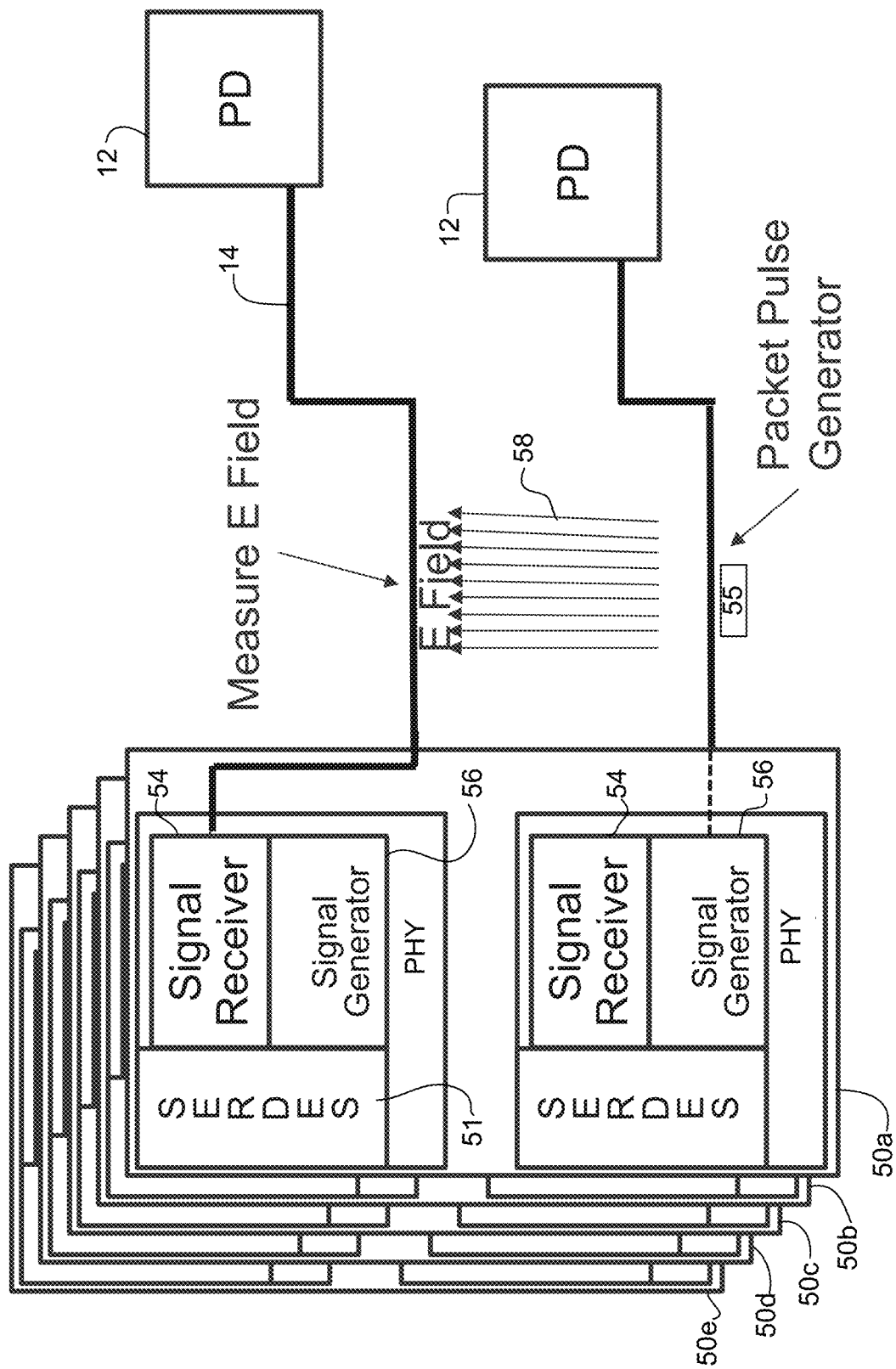
FIG. 5 illustrates detection of cable adjacencies, in accordance with another embodiment.

FIG. 5 illustrates a plurality of PSEs 50a, 50b, 50c, 50d, 50e, with one or more PSEs configured as a packet pulse generator for use in automatically calculating cable adjacency and bundle size determination, in accordance with one embodiment. The PSE includes a SerDes 51, signal receiver 54 and signal generator 56, as previously described. The PSEs may communicate with one another over an Ethernet command port communications plane or over a data plane, for example. The packet pulse generator is a specific packet type (packet 55 in FIG. 5) transmitted instead of idle packets and with a higher energy content achieved by increasing the transmitted signal. The packet 55 is detected and the receiver 54 calculates the cable to cable distance based on the field strength (E Field 58). In the example shown in FIG. 5, PSE 50b generates the packet 55 and the field strength 58 is measured by PSE 50a. The packet pulse generator allows the equipment and cable plant to change over time with constant (or periodic) updates to the cable-to-cable adjacency within the data center or office environment.

In one embodiment, the packet pulse generator carries switch IP (Internet Protocol) address and port ID (identifier) so that adjacent switches in the data center can identify where the packet is sourced from and return the received calculation for each port on the switch receiving or recognizing the packet. In one example, the packet 55 includes the source equipment IP address (e.g., IP address for Ethernet console port or command control panel), source equipment definition (e.g., what kind of switching or routing equipment), source port (e.g., port number, port power capability, port speed capability), signal data definition (e.g., data packet type (FFFF0000, FF00, AA55, etc.)), and data (e.g., as many bytes as possible of the signal data definition).

The pulsing and high frequency tests described above may be used to detect cable architecture (e.g., cable bundling, cable adjacency, bundle size) and basic dielectric calculations may be used to determine cable insulation type. In one example for a 96 port switch, a source wire pulse may be transmitted on one port and the pulse field strength measured on 95 ports. This process may be repeated through 96 ports or a fewer number of ports. In another example, a pulse may be sent on only a portion of the ports until an arrangement of the cables is identified. The cable bundling may be determined by using field strength measurements to determine cable location and cable adjacency. For example, finite element analysis and a convergence algorithm may be used to determine cable-to-cable proximity. In order to detect shielded foil, the pulse strength may be increased on a closest pair to determine if a change indicates shielded or not shielded. The measured field strength will increase with a smaller factor with a shielded cable. An algorithm output may be used to determine the proximity of cables and build a table.

As described below, the SerDes 51 at the PSE may also be used to transmit a high frequency signal, which is measured by the receiver to detect stretch of the wire over time. Also, cable adjacency may be detected through monitoring cross-talk in a pulse power system, as described below.

It is to be understood that the methods and systems described above for determining cable adjacency and bundle characteristics are only examples and that other devices or methods may be used without departing from the scope of the embodiments. Also, if bundle characteristics are known, this information may be manually input to the thermal modeling system. In one or more embodiments, both the 1 MHz pulse and packet pulse generator may be used to determine cable adjacencies. For example, the 1 MHz pulse may be used during bring up and the packet pulse generator used for periodic updates.

Figure 6A:
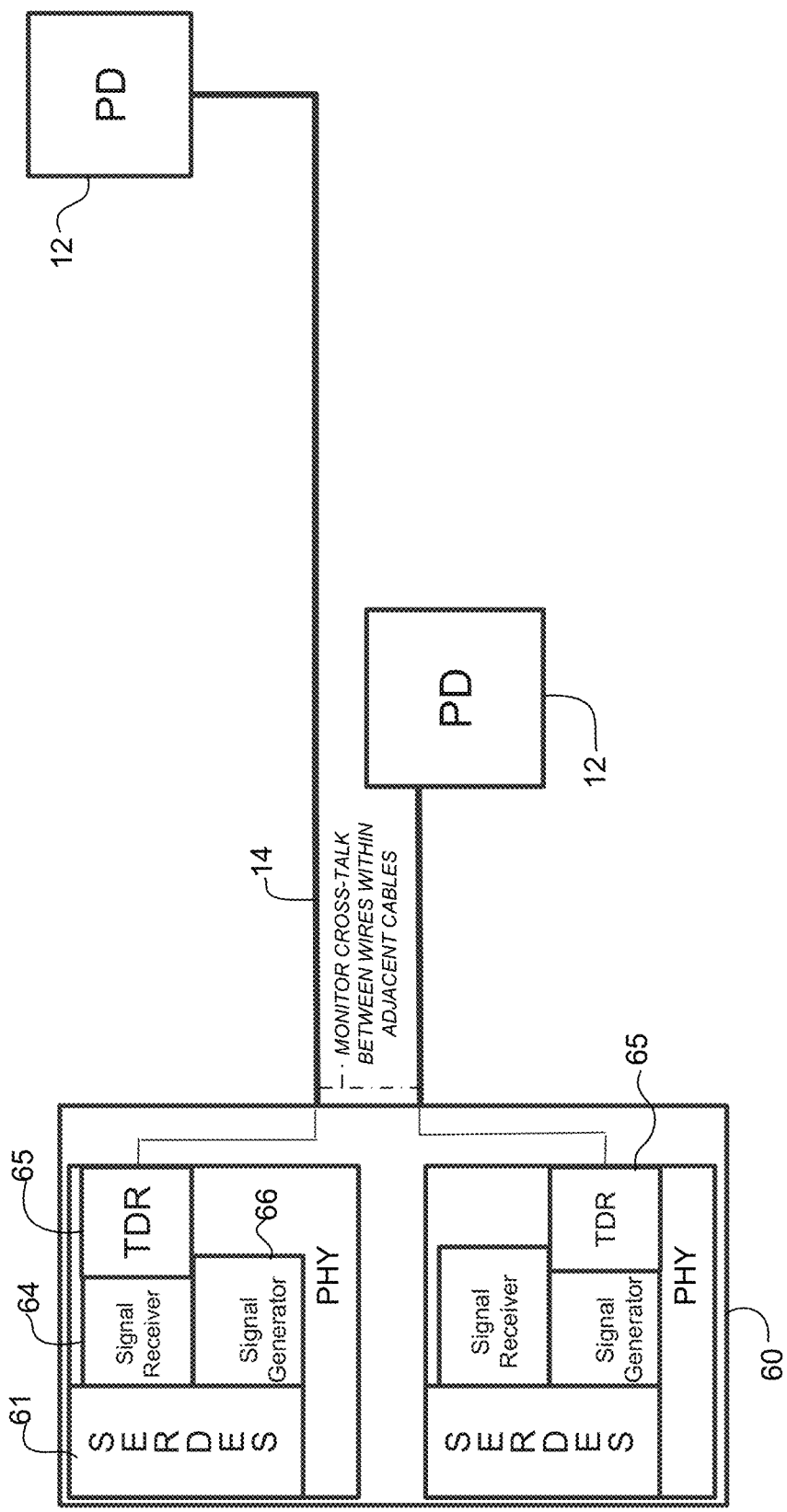
FIG. 6A illustrates use of a TDR (Time Domain Reflectometer) to determine cable length and health, in accordance with one embodiment.

FIG. 6A illustrates an embodiment that may be used to determine cable length and health. In the example shown in FIG. 6A, PSE 60 includes a SerDes 61, signal receiver 64, TDR (Time Domain Reflectometer) 65, and signal generator 66. The TDR 65 may be used to determine the cable length for any port, which may be used to calculate wire gauge (e.g., AWG). If the voltage at the PD 12 is known by the PSE 60, this may be used in conjunction with cable length to determine cable AWG per port, as previously described. The TDR 65 may also be used to evaluate and determine the cable segments and connection quality. When the PHY detects a cable is connected, a TDR process may be performed to determine the basic cable layout. TDR data may provide, for example, cable length and maximum loss, number of cable segments (length of cable segments and loss per segment, connector count and loss), and identification of cable anomalies. During a TDR process, a cable health assessment may be performed based on losses in the cable. The health assessment may determine the relative loss at each segment (conductor in a particular length of cable) and at each segment point (e.g., RJ45 connector or other type of connector). Using the defined wire gauge calculations, each cable segment in the entire cable length may be evaluated for maximum conductor current. Each connector may be evaluated for its ability to handle the port conductor current. The health assessment along with overall wire gauge calculations may be used to determine the maximum conductor current of an end-to-end cable. In one embodiment, transmit and receive equalization sequences or channel operating margin may be used in place of TDR.

Figure 6B:
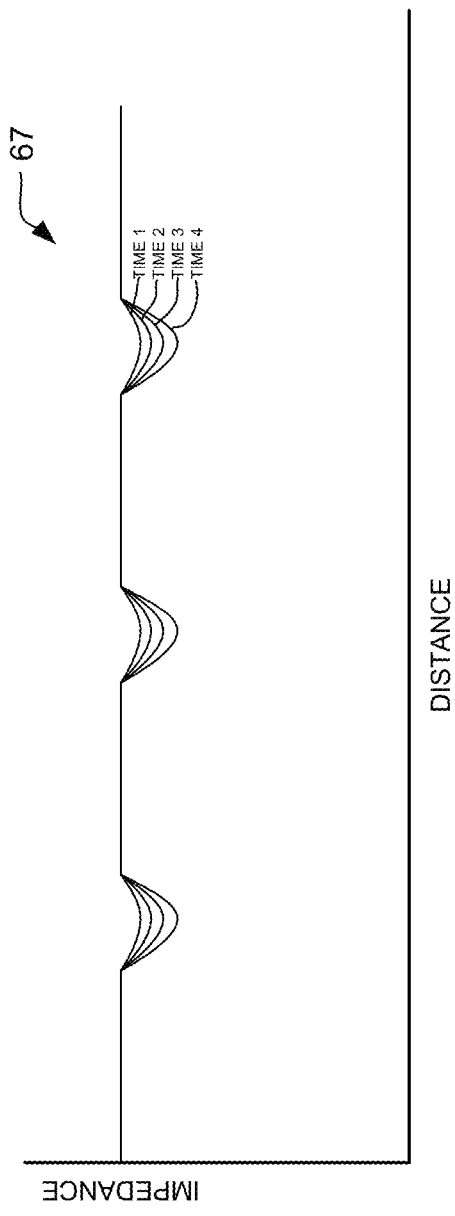
FIG. 6B is a graph illustrating use of the TDR to indicate stretching in the cable.
Figure 6C:
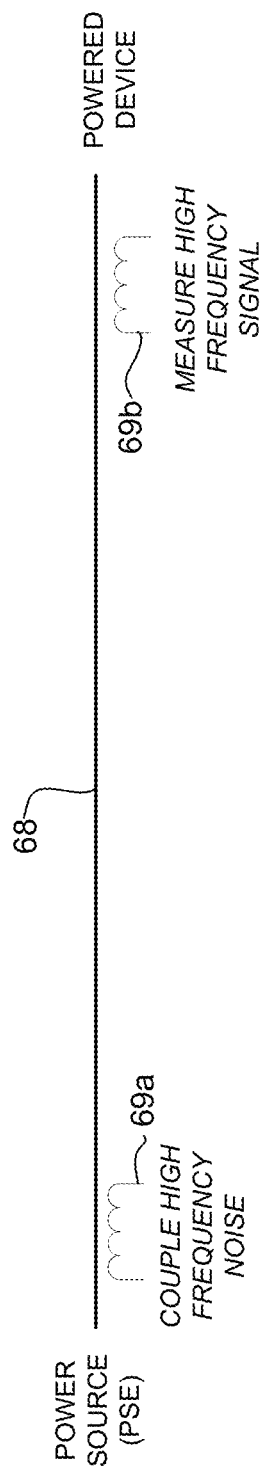
FIG. 6C illustrates a system for measuring a high frequency signal to monitor stretching in the cable.

FIGS. 6B and 6C illustrate examples for identifying wire stretch, in accordance with one or more embodiments. The vertical cable section 14a (shown in FIG. 1B) may comprise a cable bundle comprising any number of copper wires and one or more tie points along the length of the cable. The weight of the cable bundle may begin to stretch the copper wires 21 within the bundle over time. As shown in the exploded schematic view of the wire 21 in FIG. 1B, the wire may have one or more areas that become thinner over time (diameter D2) from physical strain.

In one example, the TDR 65 (FIG. 6A) may be used to identify impedance changes over time, as shown in the graph 67 of impedance over distance in FIG. 6B. Impedance is shown over the length of the wire at Time 1, Time 2, Time 3, and Time 4. These variations indicate changes in impedance due to changes in the copper wire 21. Tracking changes over time (e.g., month to month) will show the growing strain on the wires. In one or more embodiments, these changes are monitored and when a threshold level is reached, a notification (e.g., alarm is generated). For example, an impedance change ≤10% may indicate a safe condition. A change in impedance of between 10% and 20% may indicate a possible safety condition. A change in impedance of more than 20% may indicate a safety condition.

In another embodiment, high frequency loss may be used to identify a critical stretch condition. In one example high frequency loss is measured at a receiver over time. As shown in FIG. 6C, a transmitter (e.g., SerDes transmitter at the PSE) couples high frequency noise at 69a. A powered device at the other end of the cable 68 has a receiver (e.g., SerDes receiver) that measures the high frequency signal at 69b. The receiver measures amplitude over time. The stretch point of the wire will result in a high frequency impedance that grows over time. A receiver equalizer may be used to monitor the loss over time. A notification or alarm as described above may be used to indicate a safety condition.

The monitoring of the stretch as described herein may be used alone or in combination with the thermal modeling to provide an additional layer of safety monitoring or health indication of the cable.

Figure 8:
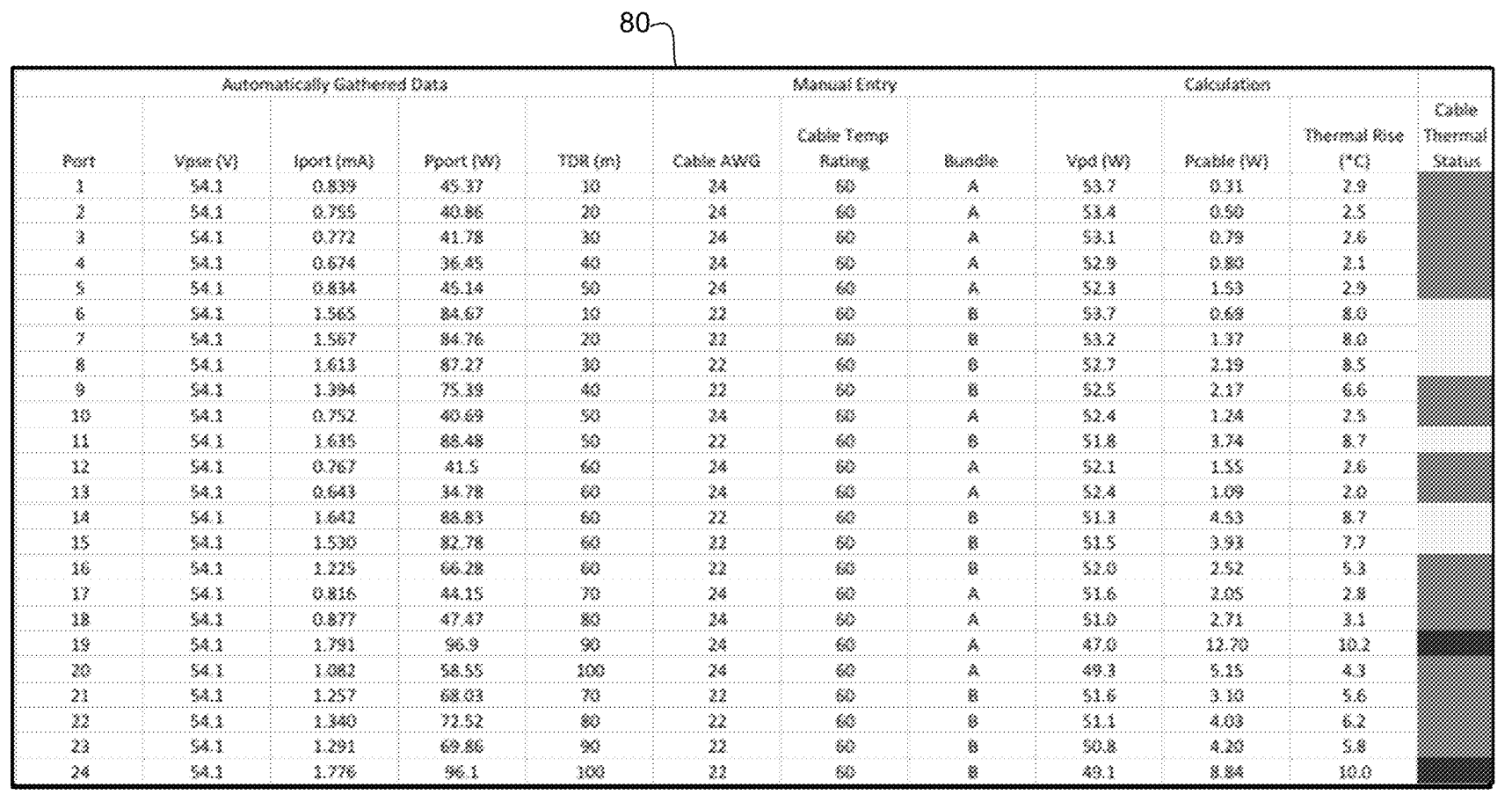

As shown in FIGS. 7, 8, 9, and 12 tables 70, 80, 90, and 120 may be created from automatically generated data, manually entered data, and calculations. The table 70 shown in FIG. 7 is based on smart PDs, which are configured to measure their input port voltage. The table 80 shown in FIG. 8 is based on a Vpd calculated by the PSE. The tables 90 and 120 shown in FIGS. 9 and 12, respectively, are based on smart PDs and automatically gathered cable bundle information.

Referring first to FIG. 7, for each port at the PSE 10 (e.g., 1-24), the table 70 includes Vpse (V_out), Iport (I_individual_cable), Pport (power_port), Vpd (V_in), TDR (length), Cable AWG (wire gauge), Cable Temp Rating, Bundle (bundle containing cable (e.g., A, B)), Pcable (calculated power dissipated by (or in) the cable), Thermal Rise, and Cable Thermal Status. The PSE 10 measures Iport, Vpse, Pport, and TDR (to determine cable length) (FIGS. 1 and 7). The PSE 10 measures the real-time current in the cable and the real-time output voltage at the PSE. In one or more embodiments, the PD 12 measures its port voltage and sends it to the PSE 10 via Layer 2. The user may input the cable temperature rating for each AWG, and the bundle in which the cable is located. This information may be input at the GUI 11 at the network operations center device 19, for example, and stored at the thermal modeling module 18. The thermal modeling module 18 (at PSE 10 or network device 19) calculates Pcable based on a combination of Iport and Vpd. The thermal rise may be calculated based on Iport and bundle size. The thermal rise calculations may take into account, for example, cable characteristics (e.g., gauge, area, length, material, insulation type), location (e.g., cable adjacency, bundle location, bundle size), electrical characteristics (e.g., current, voltage, resistance, power), thermal properties (e.g., conductive and convective properties of cable, environment (air gaps, bundling contact, maximum expected ambient temperature at location of cable routing)), or any combination of these or other variables.

The cable thermal status is based on the calculated thermal rise and maximum temperature rating of the cable and may be represented, for example, as a color (e.g., green (safe operating condition), yellow (approaching unsafe operating condition), red (unsafe operating condition)) based on a specified limit or threshold. The threshold may be based on standard temperature limits for the cable or may be user defined. Cable health may be determined based on an expected Pcable based on Iport, Vport, and TDR as compared to Pcable calculated using Vpd.

Referring now to FIG. 8, the table 80 shows an example of a risk assessment table for a system in which the PDs are not configured to measure port voltage and provide Vpd. The Vpd column in table 80 is moved from the automatically gathered data (in table 70) to the calculated data. As previously described, the PSE 10 measures Iport, Vport, Pport, and TDR (to measure cable length). A user may input AWG of cable conductors, the cable temperature rating, and the bundle containing the cable. The thermal modeling module 18 (at PSE or other network device 19) may calculate: Vpd based on Iport, Vport, cable length, and AWG; Pcable based on combination of Iport and Vpd; and thermal rise based on Iport and bundle size. The cable thermal status is based on thermal rise and may be indicated as green, yellow, or red, as described above. The cable health cannot be determined without the help of the PD.

The table 90 in FIG. 9 illustrates an automated case in which the smart PDs provide the port voltage (Vpd) and the PSE uses a signal or packet pulse (as described above with respect to FIGS. 4 and 5) to automatically determine cable bundle configuration. In this example, data including Vpse, Iport, Pport, Vpd, TDR, Cable AWG, and Bundle information is automatically gathered. The cable power (Pcable) and resulting thermal rise are calculated. As previously described, a cable thermal status column is provided to indicate the health of the cable based on thermal rise thresholds.

FIG. 12 is an example of a risk assessment table 120 for use with higher power operation (e.g., ESP), in accordance with one embodiment. The table includes the same parameters shown and described above with respect to table 90 of FIG. 9, with higher voltage and power levels.

It is to be understood that the tables 70, 80, 90, and 120 shown in FIGS. 7, 8, 9, and 12, respectively, are only examples and that different columns or data may be included or different formats used without departing from the scope of the embodiments. Also, as described above, different data may be automatically gathered or calculated based on system configuration or capability of the devices. In one or more embodiments, the table may also include a column identifying an increase in stretch in the wires, as described above.

Figure 10:
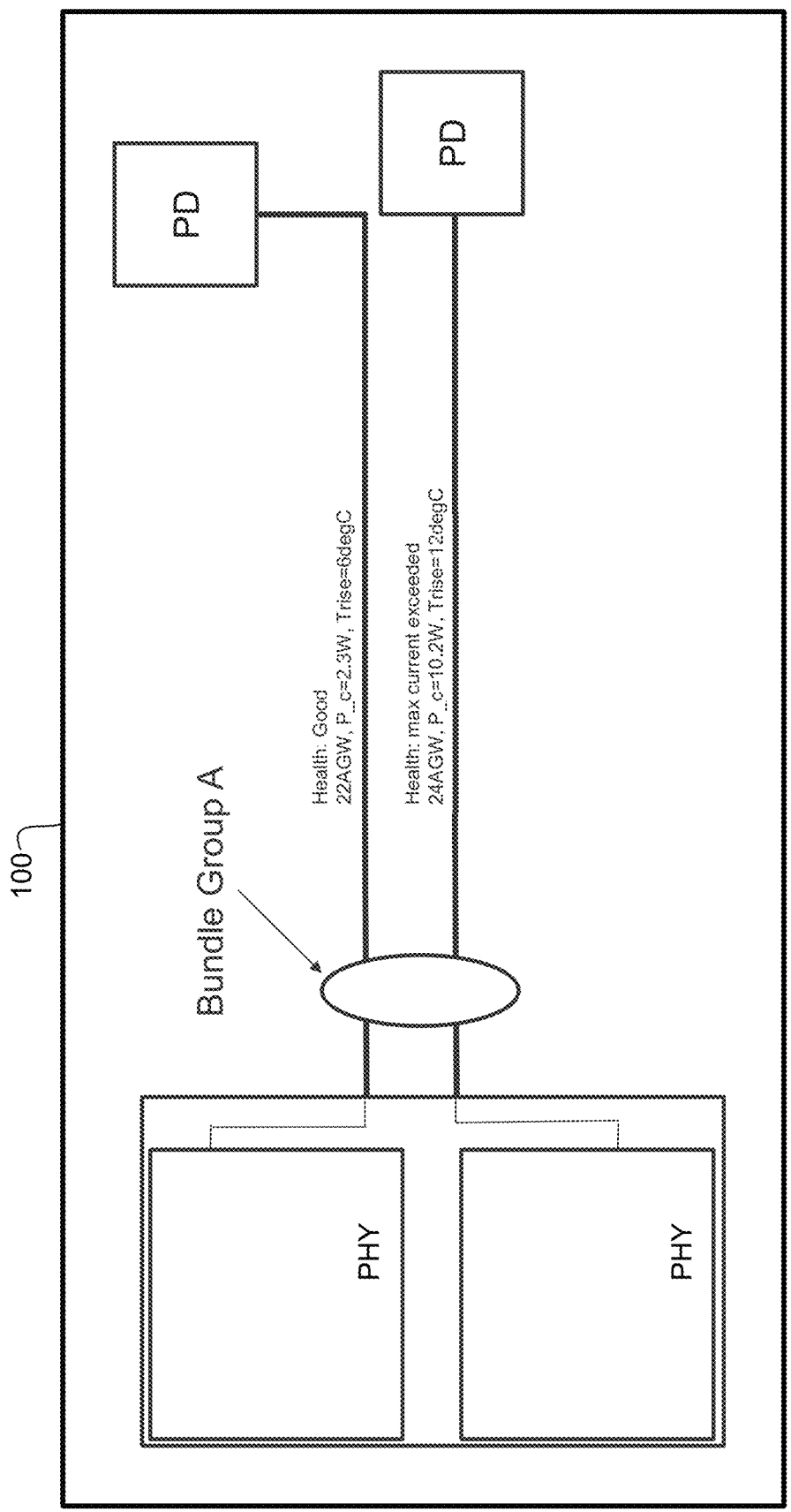
FIG. 10 illustrates a graphical view providing risk assessment and cable thermal status, in accordance with one embodiment.

FIG. 10 illustrates an example of a customer risk assessment graphical image 100. In this example, an indication is provided for each cable with respect to the risk/health assessment table. As shown in FIG. 10, one cable is identified as "Health: Good, 22AGW, P_c=2.3 W, Trise=6 degC" and another cable is identified as "Health: max current exceeded, 24AGW, P_c=10.2 W, Trise=12 degC". The graphical view 100 shown in FIG. 10 may be available on a customer screen (e.g., GUI 11 at network operations center device 19 in FIG. 1A) or on an equipment display screen.

It is to be understood that the tables 70, 80, 90, 120 shown in FIGS. 7, 8, 9, and 12 and the graphical image 100 shown in FIG. 10 are only examples and that different data, more or less data, or any combination or presentation of data may be provided in the tables or shown in the graphical view. A GUI may allow a user to select how much information or details are presented and how they are presented (e.g., table, image). Also, the user may select to view only a portion of a cable plant, one or more cable plants, or only cables or cable plants with thermal or power issues.

In addition to (or in place of) the table 70, 80, 90, 120 or schematic 100, the thermal modeling module 18 may transmit one or more alerts (alarm, message, syslog, etc.) when a specified threshold has been reached (e.g., thermal rise above a specified limit, maximum current or power exceeded in one or more cables, stretch limit exceeded). For example, the thermal modeling module 18 may determine or user input provided to define appropriate thresholds for allowable temperature rise in a cable for safe operation per port. In one example, a red cable thermal status may prevent the port from operating and a yellow cable thermal status may only allow the port to operate with user intervention. In one embodiment, the GUI may allow for a red override. The user may set the green/yellow/red threshold as appropriate for their cable plant configuration. In one embodiment, the thermal modeling module 18 may generate a flag based on worst case PD classification current. The alarm conditions may include, for example, a strict mode in which the PSE 10 monitors real-time PD currents and enforces a current limit (i.e., shuts down port when current limit is exceeded), and a non-strict mode in which the PSE monitors real-time PD currents and generates an alarm when a current limit is exceeded. The alarm and assessment information may be displayed, for example, on a system display panel or customer interface and provide an indication that attention is needed (e.g., blue attention LED (Light Emitting Diode), syslog message sent through the Ethernet control interface port to the network operations center).

Figure 11:
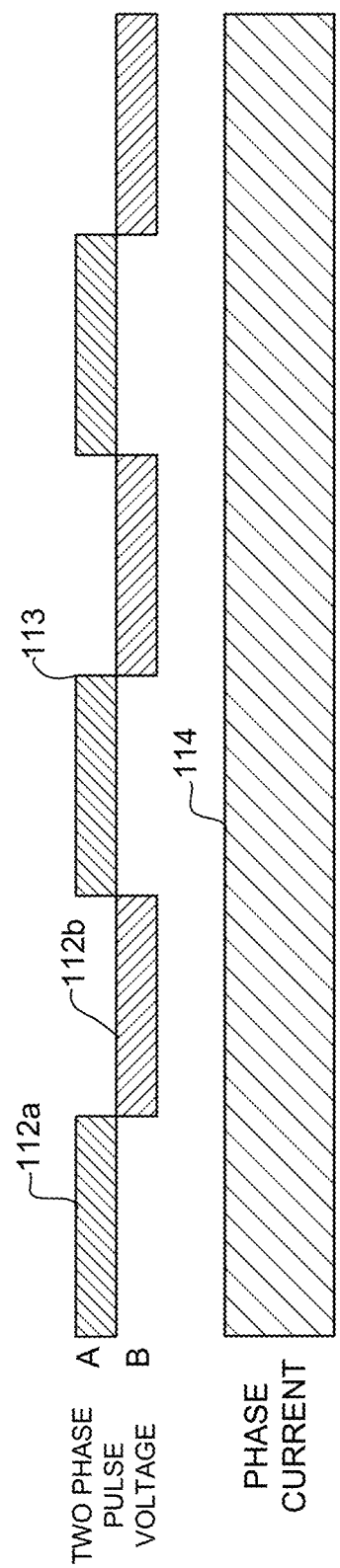
FIG. 11 is a schematic illustrating voltage and current for multi-phase pulse power, in accordance with one embodiment.

As previously described, in one or more embodiments, the power may comprise high voltage pulse power or high voltage multi-phase pulse power. FIG. 11 illustrates a simplified example of voltage and current in a two-phase pulse power system. The voltage for phase A is shown at 112a and the voltage for phase B is shown at 112b. The continuous phase current is shown at 114. The voltage is switched between a pulse on-time (e.g., voltage >24 VDC, voltage ≥60 VDC, voltage ≥380) and a pulse off-time (e.g., voltage <12V, ≤24V). It is to be understood that the voltages and currents shows in FIG. 11 illustrate a simplified example with idealized waveforms. As previously noted, the voltage during off-time may be greater than zero for use in fault detection. For example, the voltage during pulse-off time may comprise a low voltage to provide for fault sensing during pulse-off time. Also, the voltage pulse-on times may overlap between phases so that at least one wire is on at any time. During phase overlap in the multi-phase systems, the total cable current is shared across all ON wires. When the phases are combined at the PD, the result is continuous DC voltage as shown by the phase current 114. As described in U.S. patent application Ser. No. 16/380,954, referenced above, the multi-phase system may comprise any number of phases, with any phase offset or overlap.

In one or more embodiments, pulse power is monitored using the transition edges 113 of one pair and cross-talk is monitored on another pair. A level of identified cross-talk intensity may be used to determine the proximity to the pulse power line in transition. This may be used to determine bundling calculations and effective distances described above. The pulses may also be used for TDR measurements.

In one or more embodiments, a cross-talk profile may be used to filter out unintentional noise from a portion of the circuit identifying a load. For example, cross-talk may be measured on each line and filtered out from a pulse-off time determination circuit. In a tightly packed bundle, this may be used to prevent accidental shutdown due to alien cable cross-talk.

As can be observed from the foregoing, the embodiments described herein may provide many advantages. For example, one or more embodiments may be used to prevent the unwanted heating of cables (e.g., individual cables, bundle of cables) in communications cables where power is delivered over the cables to a powered device. The calculations may be done at installation and continued in real-time during idle packet transfer of the communications circuit, for example. Alarm conditions, attention lights, LCD (Liquid Crystal Display), and messaging may be used to alert the end user in the event an unwanted amount of power beyond the ability of the cable and cable environment is requested by the PD. In one or more embodiments, the PSE port may automatically limit the power available for delivery based on the ability of the cable to safely deliver the required current, and thereby prevent serious damage to the cable plant, building, or user. The embodiments may be used, for example, by network engineers who manage networks with a significant deployment of PoE, PoF, or ESP powered devices to provide a warning of deployment scenarios where the self-heating of cables could jeopardize the data integrity of the cables. The system may be used for long term planning in a cable plant, for example. One or more embodiments allow a network engineer to simply review the cable plant health assessment, which provides a more accurate assessment than may be provided with visual inspection and also saves a significant amount of time.

Although the method and apparatus have been described in accordance with the embodiments shown, one of ordinary skill in the art will readily recognize that there could be variations made to the embodiments without departing from the scope of the invention. Accordingly, it is intended that all matter contained in the above description and shown in the accompanying drawings shall be interpreted as illustrative and not in a limiting sense.

What is claimed is:

1. A method comprising:
    monitoring real-time electrical data at Power Sourcing Equipment (PSE) transmitting power over a cable to a Powered Device (PD);
    calculating thermal characteristics for the cable based on the monitored data; and
    periodically updating the thermal characteristics based on the monitored data;
    wherein the power comprises multi-phase pulse power, the data comprises voltage and current measured for each phase of said multi-phase pulse power, and the voltage is greater than 60 volts at the PSE.

2. The method of claim 1 further comprising monitoring changes in impedance in one or more wires within the cable to identify strain in said one or more wires.

3. The method of claim 1 further comprising measuring impedance with a time domain reflectometer to provide one or more parameters for use in thermal characteristics calculations.

4. The method of claim 1 further comprising identifying changes in the real-time electrical data indicating strain on one or more wires in the cable due to stretching in said one or more wires.

5. The method of claim 1 further comprising measuring cable length using a time domain reflectometer, wherein the cable length is used to calculate a wire gauge.

6. The method of claim 1 further comprising detecting an adjacent cable by measuring cross-talk between wires in the cable and the adjacent cable.

7. The method of claim 1 further comprising identifying an adjacent cable and calculating a thermal rise on the cable based at least in part on said identified adjacent cable.

8. The method of claim 1 further comprising performing a test at a voltage of less than 60 volts before transmitting the multi-phase pulse power.

9. The method of claim 4 wherein said stretching comprises a localized reduction in diameter of said one or more wires along a vertical portion of the cable.

10. The method of claim 4 further comprising monitoring said strain on said one or more wires and identifying a cable health based on changes in said monitored strain and thermal characteristics.

11. The method of claim 4 further comprising identifying a percentage of stretch over a specified threshold level and sending a notification.

12. The method of claim 4 further comprising measuring a high frequency signal at a receiver at the PD to indicate said stretching.

13. An apparatus comprising:
    a memory;
    a network interface configured to enable network communication; and
    a processor, wherein the processor is configured to perform operations comprising:
        monitoring data at Power Sourcing Equipment (PSE);
        causing power to be transmitted from the PSE over a cable to a Powered Device (PD);
        calculating thermal characteristics for the cable based on the data; and
        periodically updating the thermal characteristics based on the data;
        wherein the power comprises multi-phase pulse power, the data comprises voltage and current measured for each phase of said multi-phase pulse power, and the voltage is greater than 60 volts at the PSE.

14. The apparatus of claim 13 wherein the processor is further configured to perform operations comprising monitoring changes in impedance in one or more wires within the cable to identify strain in the one or more wires.

15. The apparatus of claim 13 wherein the processor is further configured to perform operations comprising measuring impedance with a time domain reflectometer to provide one or more parameters for use in thermal characteristics calculations.

16. The apparatus of claim 13 wherein the processor is further configured to perform operations comprising identifying changes in the data indicating strain on one or more wires in the cable due to stretching in the one or more wires.

17. The apparatus of claim 13 wherein the processor is further configured to perform operations comprising measuring cable length using a time domain reflectometer, wherein the cable length is used to calculate a wire gauge.

18. The apparatus of claim 16 wherein the stretching comprises a localized reduction in diameter of the one or more wires along a vertical portion of the cable.

19. The apparatus of claim 16 wherein the processor is further configured to perform operations comprising monitoring the strain on the one or more wires and identifying a cable health based on changes in the strain and thermal characteristics.

20. The apparatus of claim 16 wherein the processor is further configured to perform operations comprising identifying a percentage of stretch over a specified threshold level and sending a notification.

* * * * *